(12) United States Patent
Kim

(10) Patent No.: US 8,399,876 B2
(45) Date of Patent: Mar. 19, 2013

(54) SEMICONDUCTOR DIES, LIGHT-EMITTING DEVICES, METHODS OF MANUFACTURING AND METHODS OF GENERATING MULTI-WAVELENGTH LIGHT

(75) Inventor: Taek Kim, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 22 days.

(21) Appl. No.: 13/149,357

(22) Filed: May 31, 2011

(65) Prior Publication Data

US 2011/0291072 A1 Dec. 1, 2011

(30) Foreign Application Priority Data

May 31, 2010 (KR) .................. 10-2010-0051432

(51) Int. Cl.
*H01L 33/04* (2010.01)
*H01L 33/06* (2010.01)

(52) U.S. Cl. ....... 257/13; 257/79; 257/89; 257/E21.089; 257/E33.008; 257/E33.012; 257/E33.023; 362/235; 362/606; 438/47; 438/739

(58) Field of Classification Search .............. 257/13, 257/79, 89, E21.089, E33.008, E33.012, 257/E33.023; 362/235, 606; 438/47, 739
See application file for complete search history.

(56) References Cited

U.S. PATENT DOCUMENTS

| | | | |
|---|---|---|---|
| 4,776,015 A * | 10/1988 | Takeda et al. | 704/220 |
| 7,002,182 B2 | 2/2006 | Okuyama et al. | |
| 2003/0141508 A1 * | 7/2003 | Okuyama et al. | 257/79 |
| 2003/0168666 A1 | 9/2003 | Okuyama et al. | |
| 2004/0129929 A1 | 7/2004 | Okuyama et al. | |
| 2006/0198576 A1 * | 9/2006 | Furusawa et al. | 385/24 |
| 2008/0012030 A1 | 1/2008 | Yoon et al. | |
| 2009/0159869 A1 | 6/2009 | Ponce et al. | |
| 2011/0291069 A1 * | 12/2011 | Kim | 257/13 |
| 2011/0291072 A1 * | 12/2011 | Kim | 257/13 |
| 2012/0037885 A1 * | 2/2012 | Schardt et al. | 257/13 |

FOREIGN PATENT DOCUMENTS

| | | |
|---|---|---|
| JP | 2003-218395 A | 7/2003 |
| JP | 2004-119964 A | 4/2004 |
| KR | 10-0214588 B1 | 8/1999 |
| KR | 10-0755598 B1 | 9/2007 |
| KR | 10-0809234 A | 2/2008 |
| KR | 10-0857410 B1 | 9/2008 |

OTHER PUBLICATIONS

Funato et al., "Monolithic Polychromatic Light-Emitting Diodes Based on InGaN Microfacet Quantum Wells toward Tailor-Made Solid-State Lighting", Applied Physics Express 1, accepted Dec. 9, 2007; published online Jan. 17, 2008, pp. 01106-1-01106-3.

* cited by examiner

*Primary Examiner* — Dao H Nguyen
(74) *Attorney, Agent, or Firm* — Harness, Dickey & Pierce, P.L.C.

(57) ABSTRACT

A semiconductor die includes at least one first region and at least one second region. The at least one first region is configured to emit light having at least a first wavelength. The at least one second region is configured to emit light having at least a second wavelength, which is different from the first wavelength.

39 Claims, 19 Drawing Sheets

FIG. 15A

| Y | B | Y | B | Y | B |
|---|---|---|---|---|---|
| B | Y | B | Y | B | Y |
| Y | B | Y | B | Y | B |
| B | Y | B | Y | B | Y |

FIG. 15B

| Y | B | R | Y | B | R | Y | B | R | Y | B | R |
|---|---|---|---|---|---|---|---|---|---|---|---|
| B | R | Y | B | R | Y | B | R | Y | B | R | Y |
| R | Y | B | R | Y | B | R | Y | B | R | Y | B |
| Y | B | R | Y | B | R | Y | B | R | Y | B | R |
| B | R | Y | B | R | Y | B | R | Y | B | R | Y |
| R | Y | B | R | Y | B | R | Y | B | R | Y | B |
| Y | B | R | Y | B | R | Y | B | R | Y | B | R |
| B | R | Y | B | R | Y | B | R | Y | B | R | Y |

SEMICONDUCTOR DIES, LIGHT-EMITTING DEVICES, METHODS OF MANUFACTURING AND METHODS OF GENERATING MULTI-WAVELENGTH LIGHT

CROSS-REFERENCE TO RELATED APPLICATION(S)

This application claims priority under 35 U.S.C. §119 to Korean Patent Application No. 10-2010-0051432, filed on May 31, 2010, in the Korean Intellectual Property Office, the disclosure of which is incorporated herein in its entirety by reference.

BACKGROUND

1. Field

Example embodiments relate to semiconductor dies, light-emitting devices (LEDs), methods of manufacturing and methods of generating multi-wavelength light.

2. Description of the Related Art

Light emitting devices (LEDs) are relatively efficient and environmentally friendly light sources. LEDs are used in a variety of fields such as displays, optical communications, automobiles, and general lighting.

A conventional LED uses a fluorescent material to generate white light. In one example, white light is obtained by exciting red, green, and blue fluorescent materials with an ultra violet (UV) ray to emit red, green, and blue light to obtain white light. Yellow light is emitted by exciting a yellow fluorescent material that is complementary to a blue LED used as a light source to obtain white light.

Conventionally, a white color light may be generated using LEDs without a fluorescent material. In one example, each of a plurality of LEDs emits one of red, green, and blue visible rays, which are used in combination to generate the white color light. For example, an LED having an indium-gallium-nitride (InGaN) layer as a light emitting material uses the fact that the emitted color varies according to a change in mole fraction of indium (In) in the InGaN layer. However, as the content of indium (In) increases, the lattice constant increases, which results in a relatively large lattice mismatch between the relatively thin InGaN layer and a base substrate. Thus, light emission efficiency may deteriorate from a relatively short wavelength to a relatively long wavelength.

SUMMARY

Example embodiments provide light emitting devices (LEDs) having improved luminance efficiency of relatively long wavelength light.

Example embodiments also provide semiconductor dies configured to emit multi-wavelength light without using a fluorescent material, and LEDs including the same.

Example embodiments also provide methods of manufacturing semiconductor dies.

Example embodiments also provide methods of generating multi-wavelength light without using a fluorescent material.

Additional aspects will be set forth in part in the description which follows and, in part, will be apparent from the description, or may be learned by practice of the example embodiments.

At least one example embodiment provides a semiconductor die including at least one first region configured to emit light having at least a first wavelength. The at least one first region includes a plurality of first light emission structures arranged with a first gap between bases of neighboring ones of the plurality of first light emission structures. The semiconductor die further includes at least one second region having one of a planar surface and a plurality of second light emission structures. The planar surface is perpendicular to a protrusion direction of the plurality of first light emission structures, and the plurality of second light emission structures are arranged adjacent to one another. The at least one second region is configured to emit light having at least a second wavelength, which is different from the first wavelength.

According to at least some example embodiments, the plurality of second light emission structures may be arranged adjacent to one another without a gap between bases of adjacent ones of the plurality of second light emission structures. The plurality of first light emission structures may have poly-pyramid shapes. A dielectric layer portion may be disposed in each first gap. The dielectric layer portions may not be covered by the plurality of first light emission structures. Each of the plurality of first light emission structures may have a plurality of semi-polar surfaces.

According to at least some example embodiments, the at least one first region and the at least one second region may be formed on a first nitride semiconductor layer. Each of the plurality of first light emission structures may include: a base portion formed of a same material as the first nitride semiconductor layer; a first active layer formed on the base portion; and a second nitride semiconductor layer formed on the first active layer.

According to at least some example embodiments, a plurality of multi-layer structures may be disposed between the plurality of first light emission structures. Each of the plurality of multi-layer structures may include: a second active layer; a third nitride semiconductor layer formed on the second active layer; and the planar or non-polar surface. The multi-layer structures may emit light having the second wavelength, and the first wavelength may be longer than the second wavelength.

According to at least some example embodiments, a plurality of first regions and a plurality of second regions may be arranged alternately on a substrate. The plurality of first regions and the plurality of second regions may be arranged to form a light emission array.

The at least one second region may include the planar surface having a first width, and the first width may be larger than a width of the first gap.

According to at least some example embodiments, the at least one second region may include the plurality of second light emission structures, and the at least one first region may be separated from the at least one second region by a second gap. The width of the first gap may be the same or substantially the same as a width of the second gap.

The plurality of first light emission structures and the plurality of second light emission structures may be nano-sized light emission structures.

At least one other example embodiment provides a light emitting device (LED) including at least one semiconductor die. The at least one semiconductor die includes at least one first region configured to emit light having at least a first wavelength. The at least one first region includes a plurality of first light emission structures arranged with a first gap between bases of neighboring ones of the plurality of first light emission structures. The at least one semiconductor die further includes at least one second region having one of a planar surface and a plurality of second light emission structures. The planar surface is perpendicular to a protrusion direction of the plurality of first light emission structures, and the plurality of second light emission structures are arranged adjacent to one another. The at least one second region is configured to emit light having at least a second wavelength, which is different from the first wavelength.

According to at least some example embodiments, the LED may further include: a thermal heat sink; a silicon submount arranged on the thermal heat sink, wherein the at least one semiconductor die is arranged on the silicon submount; an anode lead and a cathode lead coupled to the silicon submount; an outer package enclosing the thermal heat sink; and a lens enclosing the silicon submount and the at least one semiconductor die.

At least one other example embodiment provides a semiconductor die including: at least one first region and at least one second region. The at least one first region includes a plurality of first light emission structures configured to emit light having a first wavelength. The plurality of first light emission structures are arranged with a first gap between bases of neighboring ones of the plurality of first light emission structures. The at least one second region includes a plurality of second light emission structures configured to emit light having a second wavelength. The plurality of second light emission structures are arranged with a second gap between bases of neighboring ones of the plurality of second light emission structures. A width of the second gap is different from a width of the first gap and the first wavelength is different from the second wavelength.

According to at least some example embodiments, a dielectric layer may be disposed in each first and second gap.

According to at least some example embodiments, the semiconductor die may further include at least one third region. The at least one third region may include a plurality of third light emission structures configured to emit light having a third wavelength. The plurality of third light emission structures may be arranged with a third gap between bases of neighboring ones of the plurality of first light emission structures. A width of the third gap may be different from the widths of the first and second gaps, and the third wavelength may be different from the first and second wavelengths. The plurality of first light emission structures, the plurality of second light emission structures, and the plurality of third light emission structures may be the same size. A dielectric layer may be disposed in each first, second and third gap.

According to at least some example embodiments, the plurality of first light emission structures and the plurality of second light emission structures may be nano-sized.

The plurality of first light emission structures and the plurality of second light emission structures may be the same or substantially the same size.

According to at least some example embodiments, the at least one first region and the at least one second region may be formed on a first nitride semiconductor layer. Each of the plurality of first light emission structures and the plurality of second light emission structures may include: a base portion formed of a same material as the first nitride semiconductor layer; a first active layer formed on the base portion; and a second nitride semiconductor layer formed on the first active layer.

At least one other example embodiment provides an LED including at least one semiconductor die. The at least one semiconductor die includes: at least one first region and at least one second region. The at least one first region includes a plurality of first light emission structures configured to emit light having a first wavelength. The plurality of first light emission structures are arranged with a first gap between bases of neighboring ones of the plurality of first light emission structures. The at least one second region includes a plurality of second light emission structures configured to emit light having a second wavelength. The plurality of second light emission structures are arranged with a second gap between bases of neighboring ones of the plurality of second light emission structures. A width of the second gap is different from a width of the first gap and the first wavelength is different from the second wavelength.

According to at least some example embodiments, the LED may further include: a thermal heat sink; a silicon submount arranged on the thermal heat sink, wherein the at least one semiconductor die is arranged on the silicon submount; an anode lead and a cathode lead coupled to the silicon submount; an outer package enclosing the thermal heat sink; and a lens enclosing the silicon submount and the at least one semiconductor die.

At least one other example embodiment provides a semiconductor die including at least one first region and at least one second region. The at least one first region includes a plurality of first light emission structures having a first size. The plurality of first light emission structures are arranged with a first gap between bases of neighboring ones of the plurality of first light emission structures and configured to emit light having a first wavelength. The at least one second region includes a plurality of second light emission structures having a second size, which is different from the first size. The plurality of second light emission structures are arranged with a second gap between bases of neighboring ones of the plurality of second light emission structures, and configured to emit light having a second wavelength. The first wavelength and the second wavelength are different, and widths of the first and second gaps are the same or substantially the same.

According to at least some example embodiments, the at least one first region and the at least one second region are formed on a first nitride semiconductor layer. Each of the plurality of first light emission structures and each of the plurality of second light emission structures may include: a base portion formed of a same material as the first nitride semiconductor layer; a first active layer formed on the base portion; and a second nitride semiconductor layer formed on the first active layer.

According to at least some example embodiments, a dielectric layer may be disposed in each first and second gap. The plurality of first light emission structures and the plurality of second light emission structures may be nano-sized.

At least one other example embodiment provides an LED including at least one semiconductor die. The at least one semiconductor die includes at least one first region and at least one second region. The at least one first region includes a plurality of first light emission structures having a first size. The plurality of first light emission structures are arranged with a first gap between bases of neighboring ones of the plurality of first light emission structures and configured to emit light having a first wavelength. The at least one second region includes a plurality of second light emission structures having a second size, which is different from the first size. The plurality of second light emission structures are arranged with a second gap between bases of neighboring ones of the plurality of second light emission structures, and configured to emit light having a second wavelength. The first wavelength and the second wavelength are different, and widths of the first and second gaps are the same or substantially the same.

According to at least some example embodiments, the LED may further include: a thermal heat sink; a silicon submount arranged on the thermal heat sink, wherein the at least one semiconductor die is arranged on the silicon submount; an anode lead and a cathode lead coupled to the silicon submount; an outer package enclosing the thermal heat sink; and a lens enclosing the silicon submount and the at least one semiconductor die.

At least one other example embodiment provides a semiconductor die including a plurality of light emission structures and a plurality of planar light emission surfaces arranged alternately on a substrate. The plurality of light emission structures are configured to emit light having a first wavelength, whereas the plurality of planar light emission surfaces are configured to emit light having a second wavelength. The first wavelength is different from the second wavelength.

According to at least some example embodiments, the plurality of light emission structures and the plurality of planar light emission surfaces may be nano-sized. A surface of the planar light emission surfaces may be perpendicular or substantially perpendicular to a protrusion direction of the plurality of light emission structures.

According to at least some example embodiments, the plurality of light emission structures and the plurality of planar light emission surfaces may be formed on a first nitride semiconductor layer. Each of the plurality of light emission structures may include: a base portion formed of a same material as the first nitride semiconductor layer; a first active layer formed on the base portion; and a second nitride semiconductor layer formed on the first active layer. Each of the plurality of planar light emission surfaces may have a structure including: a second active layer; a third nitride semiconductor layer formed on the second active layer; and a non-polar surface.

At least one other example embodiment provides an LED including at least one semiconductor die. The at least one semiconductor die includes a plurality of light emission structures and a plurality of planar light emission surfaces arranged alternately on a substrate. The plurality of light emission structures are configured to emit light having a first wavelength, whereas the plurality of planar light emission surfaces are configured to emit light having a second wavelength. The first wavelength is different from the second wavelength.

According to at least some example embodiments, the LED may further include: a thermal heat sink; a silicon submount arranged on the thermal heat sink, wherein the at least one semiconductor die is arranged on the silicon submount; an anode lead and a cathode lead coupled to the silicon submount; an outer package enclosing the thermal heat sink; and a lens enclosing the silicon submount and the at least one semiconductor die.

At least one other example embodiment provides a method of manufacturing a semiconductor die. According to at least this example embodiment, the method includes: forming a first nitride semiconductor layer on a substrate; patterning a dielectric layer formed on the first nitride semiconductor layer to expose portions of the first nitride semiconductor layer; forming a base structure on each exposed portion of the first nitride semiconductor layer, the base structures being formed of a same material as the first nitride semiconductor layer; forming an active layer on each base structure; and forming a second nitride semiconductor layer on the active layer.

According to at least some example embodiments, the method may further include: removing the patterned dielectric layer prior to forming the active layer and the second nitride semiconductor layer. The active layer and the second nitride semiconductor layer may be formed sequentially on each base structure and exposed portion of the first nitride semiconductor layer between neighboring ones of the base structures.

At least one other example embodiment provides a method of generating multi-wavelength light. According to at least this example embodiment, the method includes: adjusting gaps between a plurality of light emission portions formed on a substrate. Each of the plurality of light emission portions has semi-polar surfaces and includes: a base portion; a first active layer; and a nitride semiconductor layer.

According to at least some example embodiments, the plurality of light emission portions may be arranged on a nitride semiconductor layer.

BRIEF DESCRIPTION OF THE DRAWINGS

These and/or other aspects will become apparent and more readily appreciated from the following description of example embodiments, taken in conjunction with the accompanying drawings of which:

FIGS. 15A and 15B are examples of different color arrangements usable to generate white light according to example embodiments;

DETAILED DESCRIPTION

Figure 1:
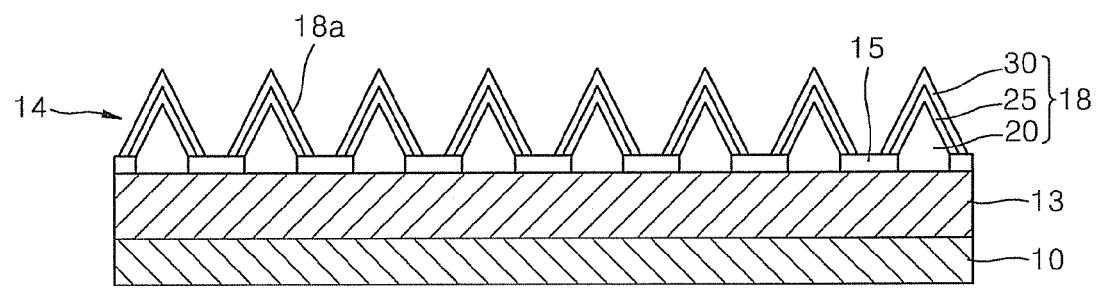
FIG. 1 is a schematic cross-sectional view illustrating a semiconductor die according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed example embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Semiconductor dies and light emitting devices (LEDs) including the same according to at least some example embodiments include one or more light emission arrays to increase light emission efficiency of relatively long wavelengths of light and/or generate multiple wavelengths of light (multi-wavelength light). The light emission arrays may be nano-sized.

Example embodiments are discussed herein with regard to light emission portions. However, the light emission portions are sometimes referred to herein as light emission structures.

FIG. 1 is a schematic cross-sectional view illustrating a semiconductor die according to an example embodiment.

Referring to FIG. 1, the semiconductor die includes a first nitride semiconductor layer 13 laminated on a substrate 10, and a light emission array 14 disposed on the first nitride semiconductor layer 13. The light emission array 14 may be nano-sized, and will be described as such herein. The substrate 10 may be a sapphire substrate, a silicon substrate, a silicon carbide (SiC) substrate, a gallium-nitride (GaN) substrate, a gallium-oxide ($Ga_2O_3$) substrate, or the like. The substrate 10 may be removed after manufacture of an LED is complete. Thus, the substrate 10 may be optional.

The nano-sized light emission array 14 includes a plurality of light emission portions (or structures) 18. The light emission portions 18 may be nano-sized, and will be referred to as such herein.

Each of the nano-sized light emission portions 18 includes a base portion 20, a first active layer 25 formed on the base portion 20, and a second nitride semiconductor layer 30 formed on the first active layer 25.

According to at least this example embodiment, the first nitride semiconductor layer 13 may be formed of a III-V group nitride semiconductor material (e.g., gallium-nitride (GaN)), and may be doped with a first type semiconductor dopant (e.g., an n-type dopant such as silicon (Si)). In this example, the first nitride semiconductor layer 13 may be an n-type GaN (n-GaN) material. A buffer layer (not shown) for epitaxial growth may be further disposed between the substrate 10 and the first nitride semiconductor layer 13. Such buffer layers are generally known, and thus, a detailed description thereof is omitted.

Still referring to FIG. 1, the first active layer 25 is a layer configured to emit light through electron-hole recombination. In one example, the first active layer 25 may be an indium-gallium-nitride (InGaN) based nitride semiconductor layer. The wavelength range of light emitted by the first active layer 25 may be adjusted by controlling band gap energy. In a more specific example, the first active layer 25 may include a quantum well layer and a barrier layer, such as InGaN/GaN, InGaN/InGaN, InGaN/AlGaN, InGaN/InAlGaN, or the like, where AlGaN is aluminum-gallium-nitride and InAlGaN is indium-aluminum-gallium-nitride. The quantum well layer may be a single quantum well (SQW) or a multi-quantum well (MQW).

Still referring to FIG. 1, the second nitride semiconductor layer 30 may be formed of a III-V group nitride semiconductor material (e.g., GaN), and may be doped with a second type semiconductor dopant (e.g., an p-type semiconductor dopant such as magnesium (Mg), calcium (Ca), zinc (Zn), cadmium (Cd), mercury (Hg), etc.). In this example, the second nitride semiconductor layer 30 is a p-type GaN (p-GaN) layer. However, the second nitride semiconductor layer 30 is not limited thereto. Rather, the first nitride semiconductor layer 13 may be a p-type semiconductor layer, and the second nitride semiconductor layer 30 may be an n-type semiconductor layer. Although not shown, carrier confinement layers for improving internal quantum efficiency may be disposed between the first nitride semiconductor layer 13 and the first active layer 25 and/or the first active layer 25 and the second nitride semiconductor layer 30. Also, although not shown, an electrode layer may be formed on the second nitride semiconductor layer 30.

A variety of methods referred to as III-V group compound semiconductor growth methods may be used to manufacture the first nitride semiconductor layer 13 and the nano-sized light emission array 14. For example, a metal organic chemical vapor deposition (MOCVD) method, a hydride vapor phase epitaxy (HVPE) method, a molecular beam epitaxy (MBE) method, a metal organic vapor phase epitaxy (MOVPE) method, a halide chemical vapor deposition (HCVD) method, or the like may be used. The nano-sized light emission array 14 includes nano-sized light emission portions 18 and emits light when driven with a current.

In the example embodiment shown in FIG. 1, the nano-sized light emission portions 18 are spaced apart from each other by a first gap. A dielectric pattern portion 15, from among a plurality of dielectric pattern portions 15, is disposed between neighboring ones of the nano-sized light emission portions 18. The dielectric pattern portions 15 may be formed of, for example, silicon-dioxide ($SiO_2$), resin, etc., to suppress and/or prevent a nitride from growing on the dielectric pattern portions 15. As shown in FIG. 1, upper surfaces of the dielectric pattern portions 15 are not covered (e.g., not entirely covered) by the light emission portions 18. Rather, at least a middle portion of the upper surface of each dielectric pattern portion 15 is exposed.

Figure 2:
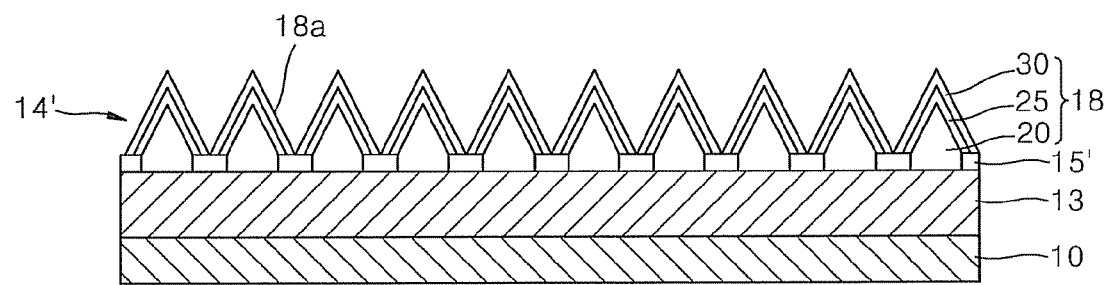
FIG. 2 is a schematic cross-sectional view illustrating a semiconductor die according to another example embodiment.

FIG. 2 is a schematic cross-sectional view illustrating a semiconductor die according to another example embodiment. The semiconductor die shown in FIG. 2 is similar to the semiconductor die shown in FIG. 1, and thus, only the differences between the example embodiments shown in FIGS. 1 and 2 will be described for the sake of brevity.

In the example embodiment shown in FIG. 2, the nano-sized light emission portions 18 are not spaced apart from one another. Rather, the nano-sized light emission portions 18 are adjacent (e.g., directly adjacent) to one another.

In more detail, as shown in FIG. 2, the semiconductor die includes a light emission array 14'. The light emission array 14' may be nano-sized and will be described as such herein. The nano-sized light emission array 14' includes a plurality of nano-sized light emission portions (or structures) 18 formed adjacent (e.g., directly adjacent) to one another, rather than spaced apart from each other as in FIG. 1. In this example embodiment, upper surfaces of a plurality of dielectric pattern portions 15' are covered by the nano-sized light emission portions 18 and not exposed as in FIG. 1.

According to at least some example embodiments, the wavelength of light emitted by a semiconductor die may vary according to gaps between the nano-sized light emission portions 18.

The nano-sized light emission portions 18 shown in FIGS. 1 and 2 include a plurality of semi-polar surfaces 18a. The semi-polar surfaces 18a are inclined with respect to the surface of the substrate 10.

Figure 3:
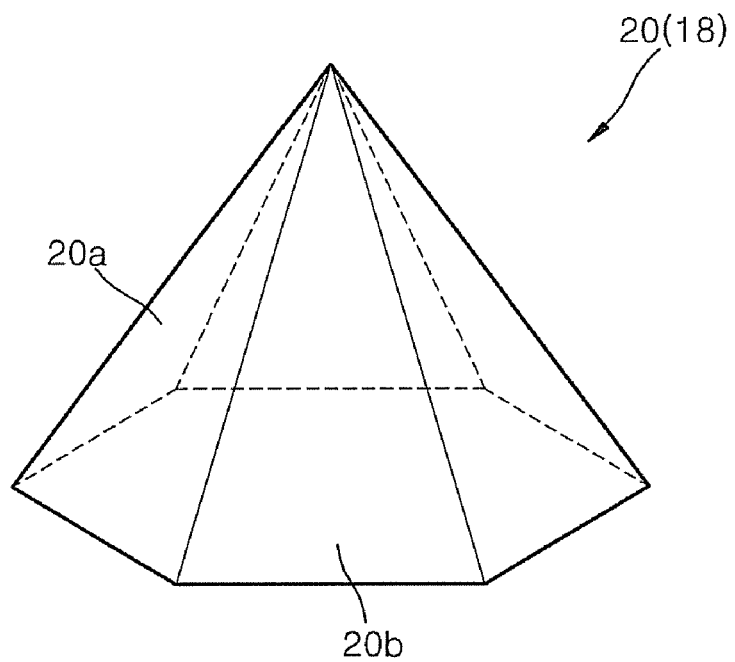
FIG. 3 illustrates light emission portions of a semiconductor die according to an example embodiment.

As mentioned above, each of the light emission portions 18 is nano-sized. In one example, the size of the nano-sized light emission portions 18 may be less than or equal to about 1 μm. For example, each of the nano-sized light emission portions 18 may have a size between about 200 nm and about 300 nm, inclusive. In another example, each of the nano-sized light emission portions 18 may have a size between about 50 nm and about 500 nm, inclusive. The size of the nano-sized light emission portions 18 may correspond to the maximum diameter of a bottom surface thereof. The nano-sized light emission portions 18 may have polygonal shapes. In FIG. 3, the nano-sized light emission portions 18 have hexagonal shapes. However, example embodiments are not limited thereto. For example, the nano-sized light emission portions 18 may be cone shaped, pyramid shaped, etc. Although FIG. 3 shows the base portion 20, the nano-sized light emission portions 18 and the base portions 20 may have substantially the same shapes. The base portions 20 include a plurality of semi-polar surfaces 20a and a plurality of bottom surfaces 20b.

The base portions 20 may be formed of the same or substantially the same material as the first nitride semiconductor layer 13. However, the base portions 20 are not limited thereto. Rather, the base portions 20 may be formed of a material different from the first nitride semiconductor layer 13.

Figure 4:
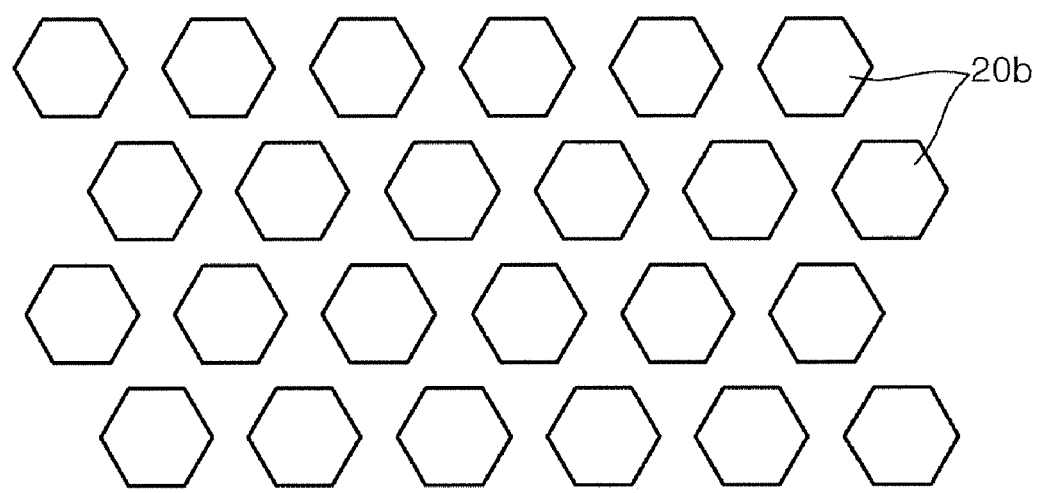
FIG. 4 illustrates an example structure of base portions of light emission portions included in a semiconductor die according to an example embodiment.

FIG. 4 illustrates an arrangement of the base portions 20 according to an example embodiment. As shown, the bottom surfaces 20b of the base portions 20 are spaced apart from one another by a given, desired or predetermined gap. In this example, the bottom surfaces 20b are arranged in a zigzag or offset arrangement from row-to-row forming a honeycomb shape. However, example embodiments are not limited thereto. In an alternative example, the base portions 20 may be arranged in a line.

According to at least some example embodiments, the nano-sized light emission portions 18 may allow the indium (In) content in, for example, an InGaN active layer to be increased more freely and/or increase internal quantum efficiency by reducing crystal defects resulting from a lattice mismatch. Furthermore, if the sizes of the nano-sized light emission portions according to at least some example embodiments are relatively small compared to a wavelength of light, extraction efficiency of the light may increase, thereby increasing external quantum efficiency.

The nano-sized light emission portions 18 contract and relax strains due to stress of an active layer, thereby reducing piezoelectric polarization resulting from the stress. By suppressing and/or preventing generation of the piezoelectric polarization, the light efficiency of light having, for example, a wavelength greater than about 500 nm may be increased. Efficiency in relatively high current operation may also be increased.

Figure 5:
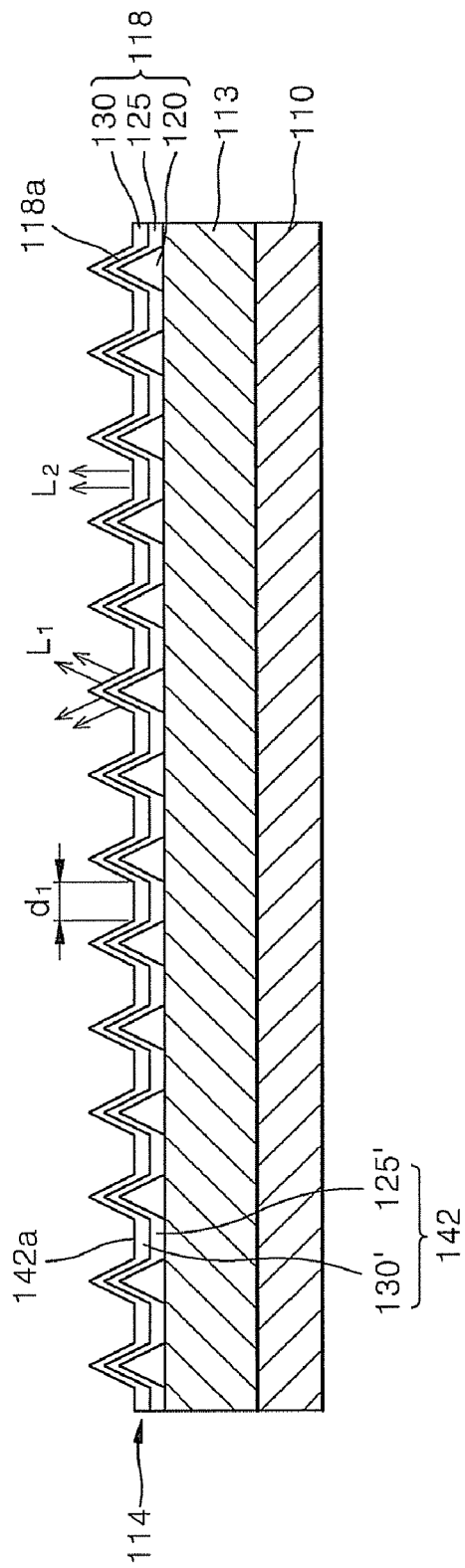
FIG. 5 is a schematic cross-sectional view illustrating a semiconductor die according to yet another example embodiment.

FIG. 5 is a schematic cross-sectional view illustrating a semiconductor die according to yet another example embodiment.

Referring to FIG. 5, the semiconductor die includes a first nitride semiconductor layer 113 formed on a substrate 110 and a light emission array 114 formed on the first nitride semiconductor layer 113. The light emission array 114 may be nano-sized and will be described herein as such.

The nano-sized light emission array 114 includes a plurality of light emission portions (or structures) 118 spaced apart from one another. The light emission portions 118 may be nano-sized and will be described herein as such.

Each nano-sized light emission portion 118 includes a base portion 120, a first active layer 125, and a second nitride semiconductor layer 130. The nano-sized light emission portions 118 include a plurality of semi-polar surfaces 118a. In one example, the nano-sized light emission portions 118 may have polypyramid shapes.

Still referring to FIG. 5, the semiconductor die further includes a plurality of multi-layer structures 142 disposed between the nano-sized light emission portions 118. Each of the multi-layer structures 142 includes a second active layer 125' and a third nitride semiconductor layer 130'. The multi-layer structures 142 include non-polar surfaces 142a in parallel or substantially parallel with the substrate 110 (e.g., (0001) surfaces). The second active layer 125' may be grown with the same or substantially the same material as the first active layer 125 at the same or substantially the same time (e.g., simultaneously or concurrently). The third nitride semiconductor layer 130' may be grown with the same or substantially the same material as the second active layer 130 at the same or substantially the same time (e.g., simultaneously or concurrently). The substrate 110, the first nitride semiconductor layer 113, and the nano-sized light emission portions 118 are the same or substantially the same as those described above with reference to FIG. 1, and thus, detailed descriptions thereof will not be repeated here. Furthermore, the same elements described with reference to FIGS. 1 and 5 have substantially the same or substantially the same functions, and thus, detailed descriptions thereof will not be repeated here.

Still referring to FIG. 5, the first active layer 125 is grown on the semi-polar surfaces 118a (e.g., a (11-11) or (11-22) surface) of the nano-sized light emission portions 118. As a result, spontaneous polarization may be reduced and/or strain may be relaxed. Accordingly, piezoelectric polarization may be reduced, thereby suppressing a quantum confined stark effect (QCSE). In other words, for example, when an InGaN active layer is formed on the semi-polar surfaces 118a of the nano-sized light emission portions 118, strain may be relaxed and occurrence of crystal defects may be reduced even when the indium (In) content of the InGaN active layer is increased. Additionally, the content of the InGaN active layer may be constant or substantially constant, which may suppress a piezoelectric field, thereby increasing light emission efficiency of longer wavelengths.

Still referring to FIG. 5, the multi-layer structures 142 include non-polar surfaces 142a, and the second active layers 125' include a quantum well layer. Although the semi-polar surfaces 118a of the nano-sized light emission portions 118 and the non-polar surfaces 142a of the multi-layer structures 142 are grown under the same or substantially the same conditions according to crystallographic characteristics, the components thereof may be different. For example, when InGaN is grown, the In content of the semi-polar surfaces 118a may be greater than the In content of the non-polar surfaces 142a. In this example, the In content of the non-polar surfaces 142a may be relatively small. Accordingly, a first light $L_1$ emitted by the semi-polar surfaces 118a may have a wavelength longer than that of a second light $L_2$ emitted by the non-polar surfaces 142a. Thus, the semiconductor die shown in FIG. 5 may emit multi-wavelength light.

The gap $d_1$ between each pair of neighboring nano-sized light emission portions 118 may be adjusted to change the wavelength of the first light $L_1$ emitted from the nano-sized light emission portions 118. The gaps $d_1$ between the nano-sized light emission portions 118 may be adjusted by adjusting the widths or areas of the multi-layer structures 142.

According to at least this example embodiment, the semiconductor die shown in FIG. 5 enables emission of white light in a single chip, but without using a fluorescent material, by emitting the first light $L_1$ and the second light $L_2$ simultaneously or concurrently. The wavelengths of the first light $L_1$ and the second light $L_2$ may be adjusted accordingly to generate the white light.

Figure 6:
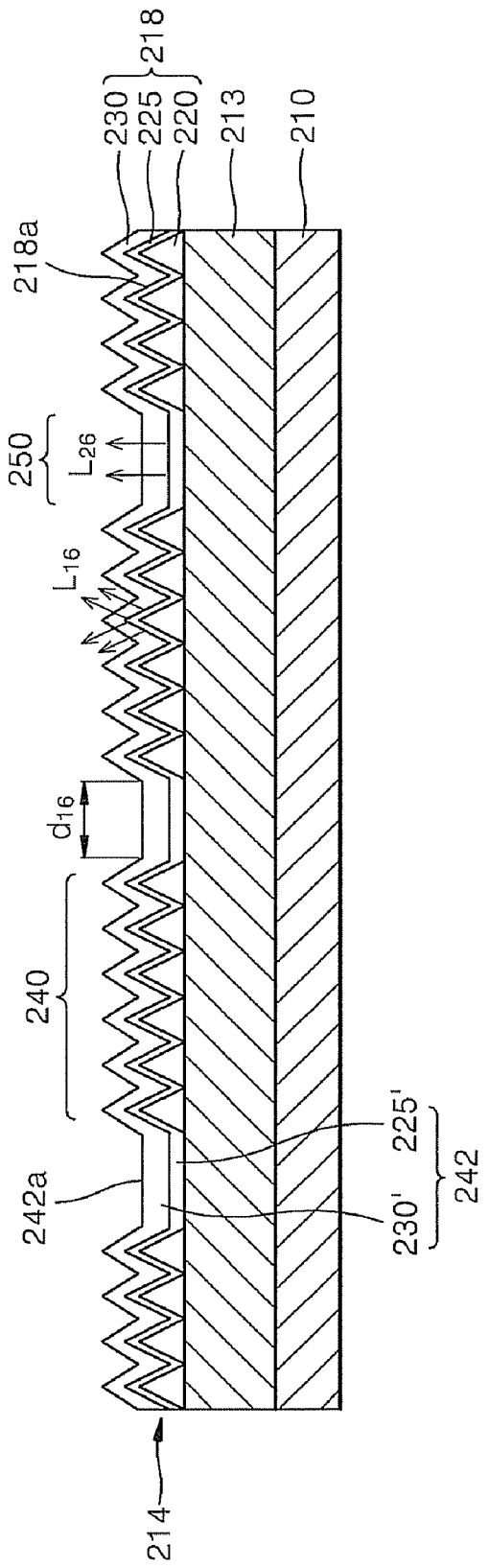
FIG. 6 is a schematic cross-sectional view illustrating a semiconductor die according to still another example embodiment.

FIG. 6 is a schematic cross-sectional view illustrating a semiconductor die according to yet another example embodiment.

Referring to FIG. 6, the semiconductor die includes a substrate 210, a first nitride semiconductor layer 213 formed on the substrate 210, and a light emission array 214 formed on the first nitride semiconductor layer 213. The light emission array 214 may be nano-sized and will be described as such herein.

The nano-sized light emission array 214 includes a plurality of light emission portions (or structures) 218 arranged in a given, desired or predetermined pattern. The light emission portions 218 may be nano-sized and will be described as such herein.

In more detail, the nano-sized light emission array 214 includes a plurality of first regions 240 and a plurality of second regions 250 arranged alternately. The plurality of first regions 240 include the nano-sized light emission portions 218 arranged continuously and adjacent (e.g., directly adjacent) to one another. The second regions 250 include a first gap $d_{16}$ in which a multi-layer structure 242 is formed. Although the example embodiment shown in FIG. 6 includes a plurality of first regions 240 and a plurality of second regions, example embodiments may include at least one first region 240 and at least one second region 250.

Within each first region 240, the nano-sized light emission portions 218 are not spaced apart from one another. Rather, as mentioned above, the nano-sized light emission portions 218 are formed continuously and adjacent (e.g., directly adjacent) to one another.

Each of the nano-sized light emission portions 218 includes a base portion 220, a first active layer 225, and a second nitride semiconductor layer 230.

Each second region 250 includes a multi-layer structure 242 arranged in the gap $d_{16}$ between pairs of neighboring first regions 240. Each of the multi-layer structures 242 includes a second active layer 225' and a third nitride semiconductor layer 230'. The first active layer 225 and the second active layer 225' may be formed (e.g., integrally) of the same or substantially the same material. The second nitride semiconductor layer 230 and the third nitride semiconductor layer 230' may be formed (e.g., integrally) of the same or substantially the same material.

Still referring to FIG. 6, the nano-sized light emission portions 218 include semi-polar surfaces 218a, whereas the multi-layer structures 242 include non-polar or planar surfaces 242a. The planar surfaces 242a may be perpendicular or substantially perpendicular to the protrusion direction of the plurality of nano-sized light emission portions 218.

In at least this example embodiment, the first light $L_{16}$ emitted by the semi-polar surfaces 218a has a longer wavelength than the second light $L_{26}$ emitted by the non-polar surfaces 242a. Thus, the semiconductor die of FIG. 6 is configured to emit multi-wavelength light. According to at least this example embodiment, the wavelength of the first light $L_{16}$ emitted by the nano-sized light emission portions 218 may be adjusted by adjusting the gap $d_{16}$ between neighboring first regions 240.

The semiconductor die shown in FIG. 6 enables emission of white light in a single chip, but without using a fluorescent material, by simultaneously or concurrently emitting the first light $L_{16}$ and the second light $L_{26}$. The wavelengths of the first light $L_{16}$ and the second light $L_{26}$ may be adjusted accordingly.

Figure 7:
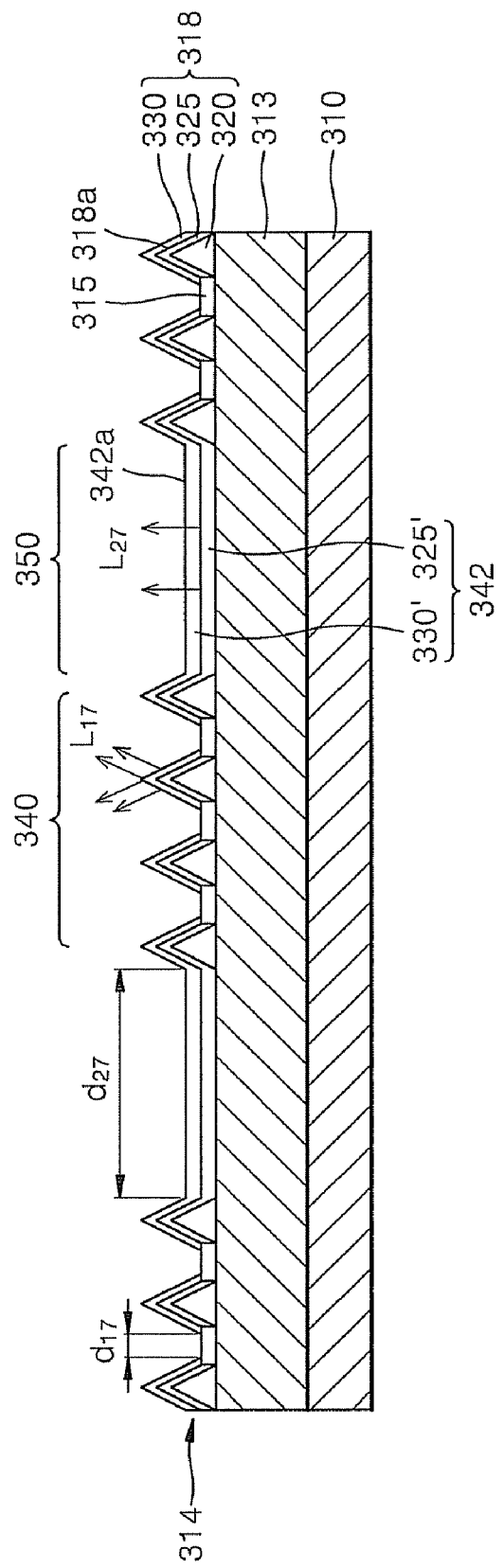
FIG. 7 is a schematic cross-sectional view illustrating a semiconductor die according to still another example embodiment.

FIG. 7 is a schematic cross-sectional view illustrating a semiconductor die according to still another example embodiment.

Referring to FIG. 7, the semiconductor die includes a substrate 310, a first nitride semiconductor layer 313 formed on the substrate 310, and a light emission array 314 formed on the first nitride semiconductor layer 313. The light emission array 314 may be nano-sized and will be described as such herein. The nano-sized light emission array 314 includes a plurality of first regions 340 and a plurality of second regions 350. Although the example embodiment shown in FIG. 7 includes a plurality of first regions 340 and a plurality of second regions 350, example embodiments may include at least one first region 340 and at least one second region 350.

Each of the plurality of first regions 340 includes a plurality of light emission portions (or structures) 318, which are spaced apart from each other by first gaps $d_{17}$. The light emission portions 318 may also be nano-sized and will be described as such herein. Each of the nano-sized light emission portions 318 includes a base portion 320, a first active layer 325, and a second nitride semiconductor layer 330.

In this example, the first regions 340 are spaced apart from one another other by the second regions 350. Each second region 350 includes a multi-layer structure 342 arranged in a second gap $d_{27}$ between each pair of neighboring first regions 340. Each of the multi-layer structures 342 includes a second active layer 325' and a third nitride semiconductor layer 330'. The first active layer 325 and the second active layer 325' may be formed (e.g., integrally) of the same or substantially the same material. The second nitride semiconductor layer 330 and the third nitride semiconductor layer 330' may be formed (e.g., integrally) of the same or substantially the same material.

The nano-sized light emission portions 318 include semi-polar surfaces 318a. The multi-layer structures 342 include non-polar or planar surfaces 342a. The planar surfaces 342a are arranged perpendicular or substantially perpendicular to the protrusion direction of the nano-sized light emission portions 318.

Within each of the first regions 340, the nano-sized light emission portions 318 are spaced apart from each other by the first gaps $d_{17}$, and a plurality of dielectric pattern portions 315 are arranged between the nano-sized light emission portions 318. The dielectric pattern portions 315 may be formed of a dielectric substance as discussed above with regard to the dielectric pattern portions 15. An active layer is not grown on the dielectric pattern portions 315.

The first light $L_{17}$ emitted by the semi-polar surfaces 318a may have a longer wavelength than the second light $L_{27}$ emitted by the non-polar surfaces 342a. Thus, the semiconductor die of FIG. 7 may emit multi-wavelength light.

The wavelength of the first light $L_{17}$ emitted by the light emission portions 318 may be adjusted by adjusting the first gap $d_{17}$ between the nano-sized light emission portions 318 and/or the second gaps $d_{27}$ between the first regions 340.

According to at least this example embodiment, the semiconductor die shown in FIG. 7 enables emission of white light in a single chip, but without using a fluorescent material, by concurrently or simultaneously emitting the first light $L_{17}$ and the second light $L_{27}$. The wavelengths of the first light $L_{17}$ and the second light $L_{27}$ may be adjusted accordingly.

Figure 17:
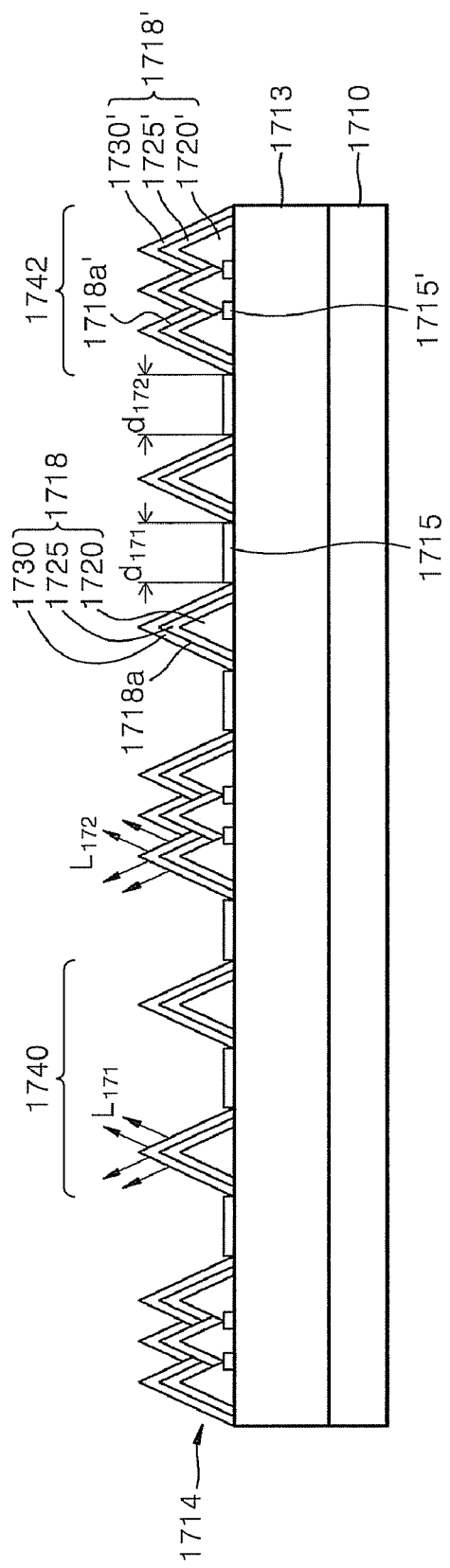
FIG. 17 is a schematic cross-sectional view illustrating a semiconductor die according to yet another example embodiment.

FIG. 17 is a schematic cross-sectional view illustrating a semiconductor die according to still another example embodiment.

Referring to FIG. 17, the semiconductor die includes a substrate 1710, a first nitride semiconductor layer 1713 formed on the substrate 1710, and a light emission array 1714 formed on the first nitride semiconductor layer 1713. The light emission array 1714 may be nano-sized and will be discussed as such herein.

The nano-sized light emission array 1714 includes a plurality of first regions 1740 and a plurality of second regions 1742. Although the example embodiment shown in FIG. 17 includes a plurality of first regions 1740 and a plurality of second regions 1742, example embodiments may include at least one first region 1740 and at least one second region 1742.

Each of the plurality of first regions 1740 includes a plurality of light emission portions (or structures) 1718, which are spaced apart from each other by first gaps $d_{171}$. The light emission portions 1718 may be nano-sized and will be described as such herein. Each of the nano-sized light emission portions 1718 includes a base portion 1720, a first active layer 1725, and a second nitride semiconductor layer 1730.

Each of the plurality of second regions 1742 includes a plurality of light emission portions (or structures) 1718'. The plurality of light emission portions 1718' may be nano-sized and will be described as such herein. Each of the nano-sized light emission portions 1718' includes a base portion 1720', a first active layer 1725', and a second nitride semiconductor layer 1730'. The plurality of nano-sized light emission portions 1718' are arranged continuously and adjacent (e.g., directly adjacent) to one another. A relatively small dielectric pattern portion 1715' is formed between each pair of neighboring nano-sized light emission portions 1718'.

Each first region 1740 is spaced apart from a neighboring second region 1742 by a second gap $d_{172}$.

The nano-sized light emission portions 1718 include semi-polar surfaces 1718a and the nano-sized light emission portions 1718' include semi-polar surfaces 1718a'. The semi-polar surfaces 1718a may emit first light $L_{171}$ having a first wavelength, whereas the semi-polar surfaces 1718a' may emit second light $L_{172}$ having a second wavelength. The first wavelength and the second wavelength may be different. For example, the first wavelength may be greater than the second wavelength. Thus, the semiconductor die of FIG. 17 may emit multi-wavelength light. By generating multi-wavelength light, the semiconductor die of FIG. 17 may be used to generate white light from a single chip without the use of a fluorescent material.

Figure 18:
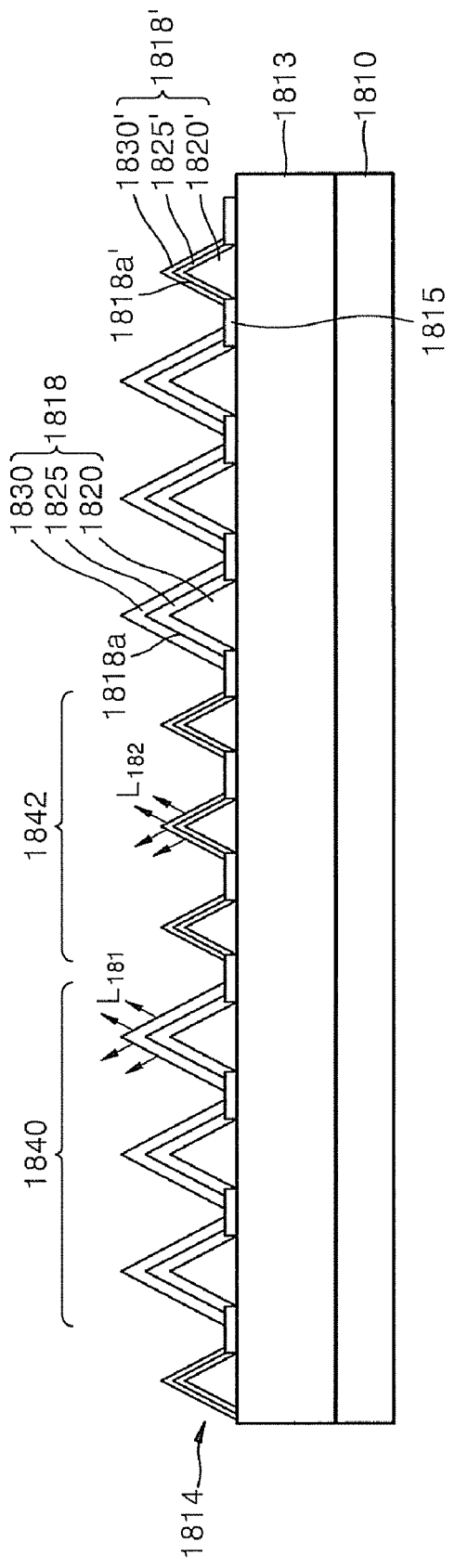
FIG. 18 is a schematic cross-sectional view illustrating a semiconductor die according to still another example embodiment.

FIG. 18 is a schematic cross-sectional view illustrating a semiconductor die according to yet another example embodiment.

Referring to FIG. 18, the semiconductor die includes a substrate 1810, a first nitride semiconductor layer 1813 formed on the substrate 1810, and a light emission array 1814 formed on the first nitride semiconductor layer 1813. The light emission array 1814 may be nano-sized and will be described as such herein.

The nano-sized light emission array 1814 includes a plurality of first regions 1840 and a plurality of second regions 1842. Although the example embodiment shown in FIG. 18 includes a plurality of first regions 1840 and a plurality of second regions 1842, example embodiments may include at least one first region 1840 and at least one second region 1842.

Each of the plurality of first regions 1840 includes a plurality of light emission portions (or structures) 1818. The plurality of light emission portions 1818 may be nano-sized and will be described as such herein. The plurality of nano-sized light emission portions 1818 may be spaced apart from each other by a first gap.

Each of the nano-sized light emission portions 1818 includes a base portion 1820, a first active layer 1825, and a second nitride semiconductor layer 1830. A dielectric pattern portion 1815 is formed between each pair of neighboring nano-sized light emission portions 1818.

The nano-sized light emission portions 1818 include semi-polar surfaces 1818a. The semi-polar surfaces 1818a may emit first light $L_{181}$ having a first wavelength.

Each of the plurality of second regions 1842 includes a plurality of light emission portions (or structures) 1818'. The plurality of light emission portions 1818' may be spaced apart from one other by a second gap. The width of the second gap may be the same or different from the width of the first gap. The plurality of light emission portions 1818' may be nano-sized and will be described as such herein. Each of the nano-sized light emission portions 1818' includes a base portion 1820', a first active layer 1825', and a second nitride semiconductor layer 1830'. A dielectric pattern portion 1815 is formed between each pair of neighboring nano-sized light emission portions 1818'. The nano-sized light emission portions 1818' include semi-polar surfaces 1818a'. The semi-polar surfaces 1818a' may emit second light $L_{182}$ having a second wavelength. The first and second wavelengths may be different. For example, the second wavelength may be greater than the first wavelength. Thus, the semiconductor die of FIG. 18 may emit multi-wavelength light.

In this example, the first gap between the plurality of light emission portions 1818, the second gap between the plurality of nano emission portions 1818' and the gap between the plurality of first regions 1840 and the plurality of second regions 1842 is the same or substantially the same. However, one or more of these gaps may be different from the other.

Still referring to FIG. 18, the plurality of nano-sized light emission portions 1818 in the first regions 1840 are larger in size than the plurality of nano-sized light emission portions 1818' in the second regions 1842. In this example, each of the plurality of nano-sized light emission portions 1818 has a first size and each of the plurality of nano-sized light emission portions has a second size, and the first size is larger than the second size.

Figure 8:
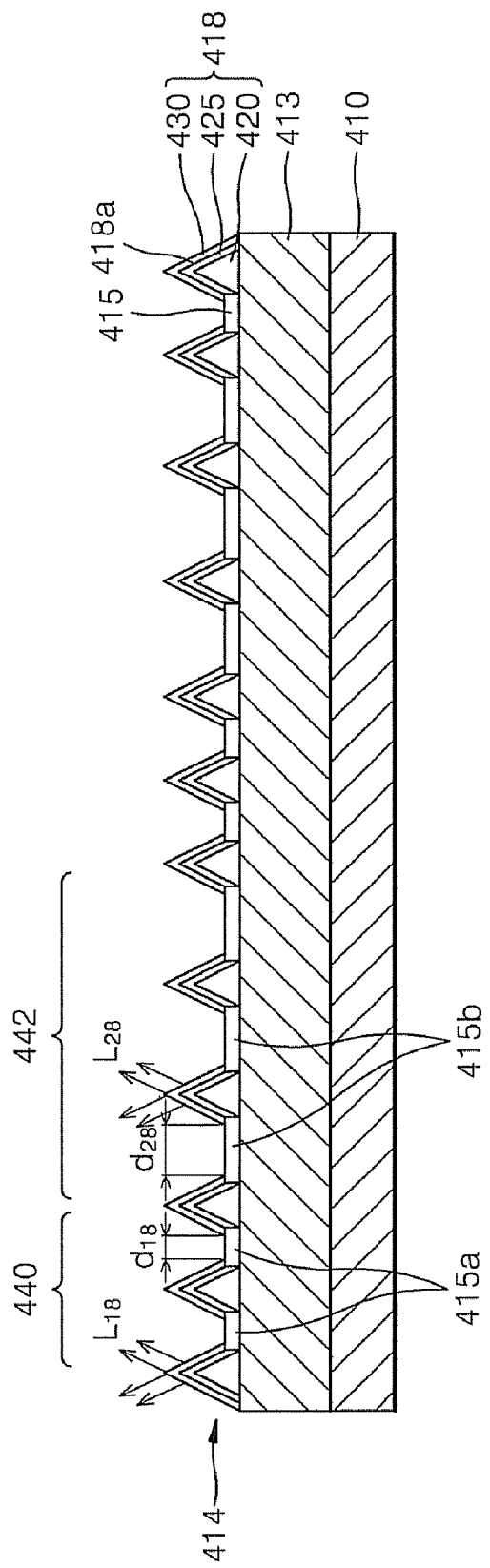
FIG. 8 is a schematic cross-sectional view illustrating a semiconductor die according to another example embodiment.

FIG. 8 is a schematic cross-sectional view illustrating a semiconductor die according to yet another example embodiment.

Referring to FIG. 8, the semiconductor die includes a substrate 410, a first nitride semiconductor layer 413 formed on the substrate 410, and a light emission array 414 formed on the first nitride semiconductor layer 413. The light emission array 414 may be nano-sized and will be described as such herein.

The nano-sized light emission array 414 includes a plurality of first regions 440 and a plurality of second regions 442. Although a plurality of first regions 440 and a plurality of second regions 442 are shown, example embodiments may include one or more first regions 440 and one or more second regions 442.

Each of the plurality of first regions 440 includes a plurality of light emission portions (or structures) 418. The plurality of light emission portions 418 may be nano-sized and will be described as such herein. The nano-sized light emission portions 418 are spaced apart from each other by first gaps $d_{18}$.

Each of the plurality of second regions 442 also includes a plurality of nano-sized light emission portions (or structures) 418. However, the plurality of nano-sized light emission portions 418 in the second regions 442 are spaced apart from each other by second gaps $d_{28}$. In this example, the width of the second gaps $d_{28}$ is greater than the width of the first gaps $d_{18}$.

Each of the nano-sized light emission portions 418 includes a base portion 420, a first active layer 425 formed on the base portion 420, and a second nitride semiconductor layer 430 formed on the first active layer 425. Each nano-sized light emission portion 418 includes semi-polar surfaces 418a.

A plurality of dielectric pattern portions 415 are arranged between the nano-sized light emission portions 418.

In the example embodiment shown in FIG. 8, within the first regions 440, first dielectric pattern portions 415a are arranged in the first gaps $d_{18}$ between the nano-sized light emission portions 418, whereas within the second regions 442, second dielectric pattern portions 415b are arranged in the second gaps $d_{28}$ between the nano-sized light emission portions 418.

According to at least this example embodiment, the wavelength of light emitted by the nano-sized light emission portions 418 may be adjusted by adjusting the width of the gaps between the nano-sized light emission portions 418. For example, the nano-sized light emission portions 418 in the first regions 440 may emit first light $L_{18}$ having a first wavelength, whereas the nano-sized light emission portions 418 in the second regions 442 may emit second light $L_{28}$ having a second wavelength, which is different from the first wavelength. Accordingly, the semiconductor die of FIG. 8 may enable emission of white light in a single chip without the use of a fluorescent material by emitting the first light $L_{18}$ having the first wavelength and the second light $L_{28}$ having the second wavelength.

Figure 9:
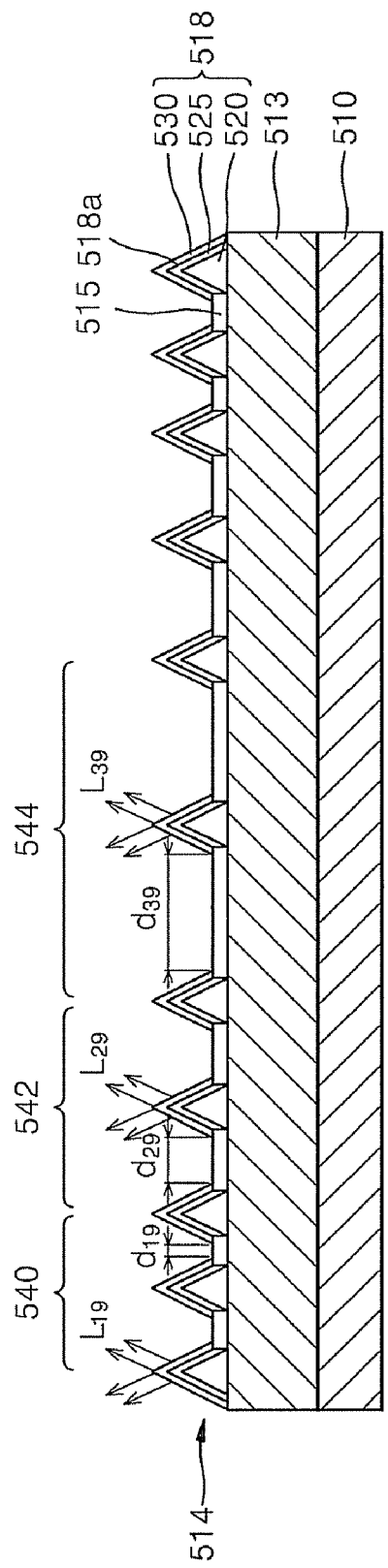
FIG. 9 is a schematic cross-sectional view illustrating a semiconductor die according to another example embodiment.

FIG. 9 is a schematic cross-sectional view illustrating a semiconductor die according to still another example embodiment.

Referring to FIG. 9, the semiconductor die includes a substrate 510, a first nitride semiconductor layer 513 formed on the substrate 510, and a light emission array 514 formed on the first nitride semiconductor layer 513. The light emission array 514 may be nano-sized and will be described as such herein.

The nano-sized light emission array 514 includes a plurality of light emission portions (or structures) 518 arranged in a given, desired or predetermined pattern. The plurality of light emission portions 518 may be nano-sized and will be described as such herein.

Each of the plurality of nano-sized light emission portions 518 includes a base portion 520, a first active layer 525, and a second nitride semiconductor layer 530. Each nano-sized light emission portion 518 includes a semi-polar surface 518a, and may have a polypyramid shape.

The nano-sized light emission array 514 includes a plurality of first regions 540, a plurality of second regions 542 and a plurality of third regions 544. Although FIG. 9 shows a plurality of first regions 540, a plurality of second regions 542 and a plurality of third regions 544, example embodiments may include one or more first regions 540, one or more second regions 542 and one or more third regions 544.

Each of the plurality of first regions 540 includes a plurality of nano-sized light emission portions 518 spaced apart from one another by a first gap $d_{19}$.

Each of the plurality of second regions 542 includes a plurality of nano-sized light emission portions 518 spaced apart from one other by a second gap $d_{29}$.

Each of the plurality of third regions 544 includes a plurality of nano-sized light emission portions 518 spaced apart from one another by a third gap $d_{39}$.

The widths of the first gaps $d_{19}$, the second gaps $d_{29}$ and the third gaps $d_{39}$ may be different. In the example shown in FIG. 9, the width of the second gaps $d_{29}$ is greater than the width of the first gaps $d_{19}$ and the width of the third gaps $d_{39}$ is greater than the width of the second gaps $d_{29}$.

A plurality of dielectric pattern portions 515 are arranged between the nano-sized light emission portions 518. In this example embodiment, no active layer is grown on the dielectric pattern portions 515.

The nano-sized light emission portions 518 in each of the first, second, and third regions 540, 542, and 544 emit different wavelengths of light according to the widths of the first, second, and third gaps $d_{19}$, $d_{29}$, and $d_{39}$. For example, the nano-sized light emission portions 518 in the first regions 540, which are spaced apart from each other by the first gaps $d_{19}$, may emit first light $L_{19}$ having a first wavelength. The nano-sized light emission portions 518 in the second regions 542, which are spaced apart from each other by second gaps $d_{29}$, may emit second light $L_{29}$ having a second wavelength. The nano-sized light emission portions 518 in the third regions 544, which are spaced apart from each other by the third gaps $d_{39}$, may emit third light $L_{39}$ having a third wavelength. The first, second, and third wavelengths may be different from each other.

The semiconductor die of FIG. 9 enables generation of white light in a single chip without using a fluorescent material by emitting three or more wavelengths of light. The wavelengths of light may be adjusted accordingly by adjusting the width of the gaps between the nano-sized light emission portions 518. Semiconductor dies according to at least some example embodiments may increase light emission efficiency of relatively long wavelengths.

Figure 10:
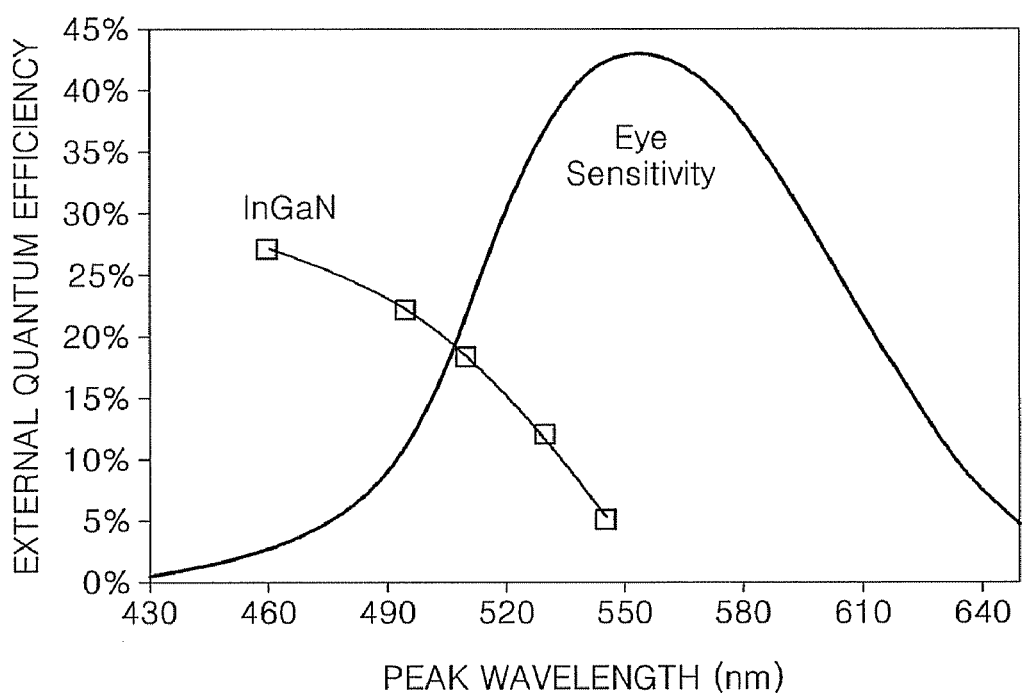
FIG. 10 is a graph showing variations in external quantum efficiency and eye sensitivity with respect to a peak wavelength of an InGaN semiconductor die according to an example embodiment.

FIG. 10 is a graph showing example variations in external quantum efficiency and eye sensitivity with respect to a peak wavelength of a semiconductor die according to an example embodiment. In this example embodiment, the semiconductor die includes an InGaN active layer.

Referring to FIG. 10, as the external quantum efficiency of the semiconductor die decreases, the peak wavelength increases. However, eye sensitivity is relatively high at wavelengths between, for example, about 520 nm and about 580 nm, inclusive. And, eye sensitivity may be relatively important to illuminating light. Thus, emitting light of a wavelength band having relatively high eye sensitivity as LED illumination light may also be relatively important. Accordingly, it may be necessary to increase the external quantum efficiency of light having relatively long wavelengths, for example, a wavelength greater than or equal to about 500 nm. An indium (In) mole fraction of the InGaN active layer may be increased in order to increase the wavelength of light. However, such an increase in the In mole fraction may result in: an increase in a piezoelectric field; a lattice mismatch between the InGaN active layer; and/or deterioration of a nitride semiconductor layer. Moreover, an increase in the In mole fraction may result in phase separation due to In localization and an increase in impurity content due to relatively low temperature growth. Thus, light efficiency of relatively long wavelengths may deteriorate.

According to at least some example embodiments, however, semiconductor dies are nano-sized and include nano-sized light emission portions having a plurality of semi-polar surfaces, thereby increasing light efficiency of relatively long wavelengths. An active layer is grown on the semi-polar surfaces, which may reduce spontaneous polarization and/or relax strain, which may reduce piezoelectric polarization. Furthermore, when, for example, an InGaN active layer is formed on the semi-polar surfaces of the nano-sized light emission portions, strain may be relaxed and occurrence of crystal defects may be reduced even when the In content of the InGaN active layer is increased. Moreover, the content of the InGaN active layer is constant or substantially constant, and thus, a piezoelectric field may be suppressed, thereby increasing light emission efficiency of relatively long wavelengths. Accordingly, semiconductor dies according to at least some example embodiments may be more suitable for illumination light by increasing the light emission efficiency of relatively long wavelength bands of light having relatively high eye sensitivity. In addition, although a plurality of quantum well layers having different wavelengths may be included in a single p-n junction by suppressing generation of the piezoelectric field, color temperature consistency may increase because the relative sensitivity of light having different wavelengths does not vary greatly according to a variation in a current density. Thus, semiconductor dies according to at least some example embodiments (and LEDs including the same) may be more suitable for light illumination.

FIGS. 11A through 11D are views for explaining a method of manufacturing a semiconductor die according to an example embodiment. The method shown in FIGS. 11A through 11D will be described with regard to manufacturing the semiconductor die shown in FIG. 1.

Figure 11A:
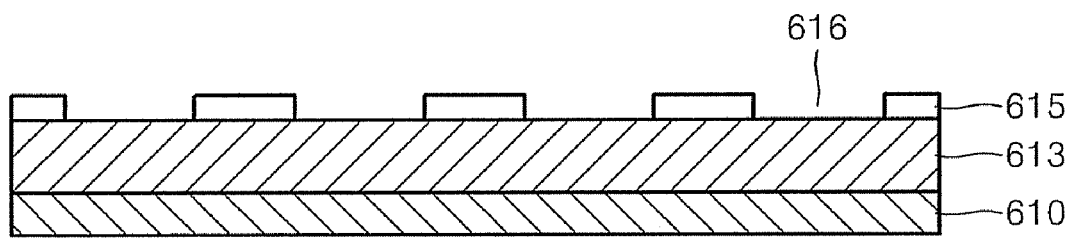
FIGS. 11A through 11D are views for explaining a method of manufacturing a semiconductor die according to an example embodiment.

Referring to FIG. 11A, a first nitride semiconductor layer 613 is stacked on a substrate 610, and a dielectric layer pattern 615 is stacked on the first nitride semiconductor layer 613. The dielectric pattern 615 includes exposure portions 616 through which portions of the first nitride semiconductor layer 613 are exposed. The dielectric pattern 615 is formed by patterning a dielectric layer.

Figure 11B:
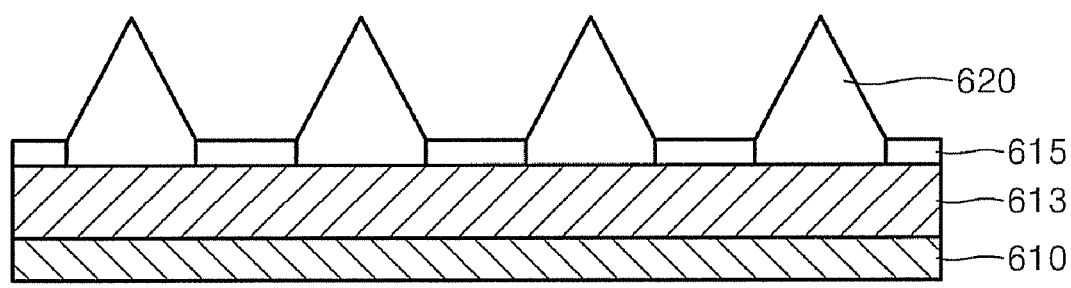

Referring to FIG. 11B, a base portion 620 is grown on each exposure portion 616 using a nitride semiconductor. In this example, the base portions 620 are grown to include semi-polar surfaces that are inclined with respect to the substrate 610. The nitride semiconductor is selectively grown such that the nitride semiconductor is not grown on the dielectric layer pattern 615. Rather, as shown, the nitride semiconductor is selectively grown on the exposure portions 616.

Figure 11C:
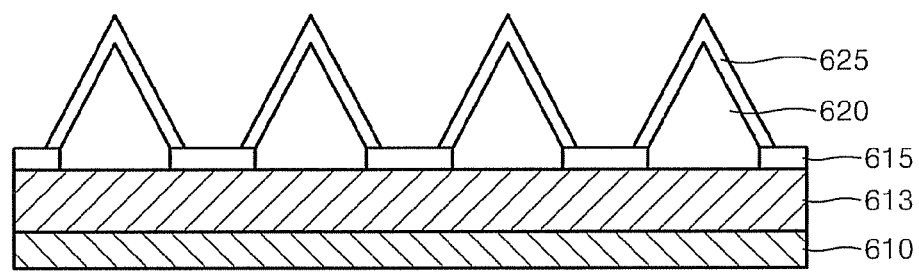
Figure 11D:
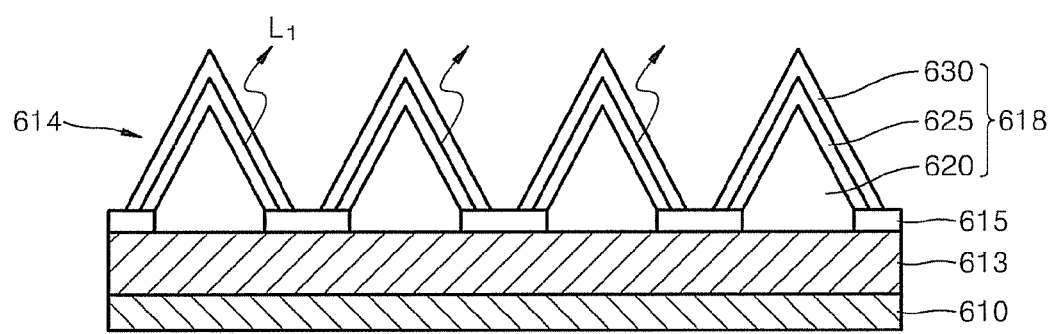

Referring to FIGS. 11C and 11D, an active layer 625 and a second nitride semiconductor layer 630 are grown on the base portion 620. The base portions 620, the active layers 625, and the second nitride semiconductor layers 630 form nano-sized light emission portions 618. The nano-sized light emission portions 618 are arranged in a given, desired or predetermined gap to form a nano-sized light emission array 614.

As shown in FIG. 11D, the nano-sized light emission portions 618 may emit the first light L1. Although the nano-sized light emission portions 618 are arranged in the given, desired or predetermined gap in FIG. 11D, the nano-sized light emission portions 618 may be arranged without gaps there between. Furthermore, the gaps between the nano-sized light emission portions 618 may be adjusted by adjusting a pattern of the dielectric layer pattern 615 to adjust a wavelength of emitted light. Light of multiple different wavelengths may be emitted by adjusting two or more types of gaps between the nano-sized light emission portions 618.

FIGS. 12A through 12D are views for explaining a method of manufacturing a semiconductor die according to another example embodiment. The method shown in FIGS. 12A through 12D will be described with regard to manufacturing the semiconductor die shown in FIG. 5.

Figure 12A:
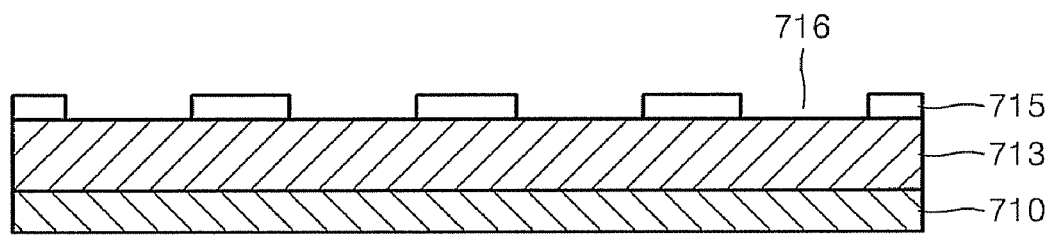
FIGS. 12A through 12D are views for explaining a method of manufacturing a semiconductor die according to another example embodiment.

Referring to FIG. 12A, a first nitride semiconductor layer 713 is stacked on a substrate 710, and a dielectric layer pattern 715 is stacked on the first nitride semiconductor layer 713. The dielectric layer pattern 715 includes exposure portions 716 through which portions of the first nitride semiconductor layer 713 are exposed.

Figure 12B:
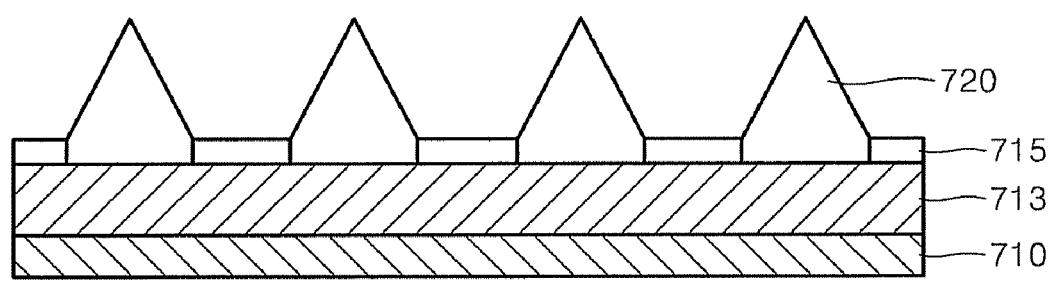

Referring to FIG. 12B, base portions 720 are grown on the exposure portion 716. The base portions 720 are grown in the same or substantially the same manner as the base portions 620 discussed above with regard to FIGS. 11A through 11D.

Figure 12C:
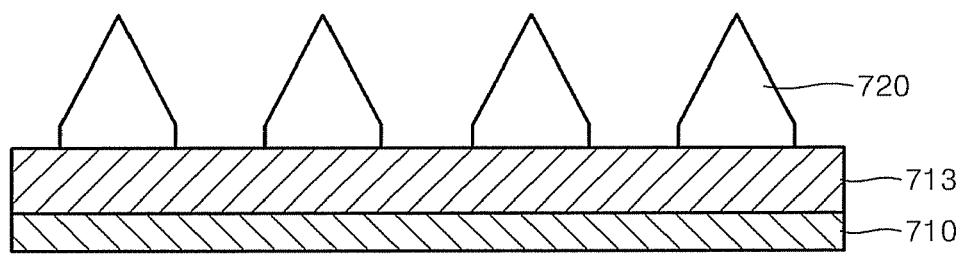

Referring to FIG. 12C, the dielectric layer pattern 715 is removed from the first nitride semiconductor layer 713 to expose portions of the first nitride semiconductor layer 713. The dielectric layer pattern 715 may be removed in any known manner (e.g., by etching).

Figure 12D:
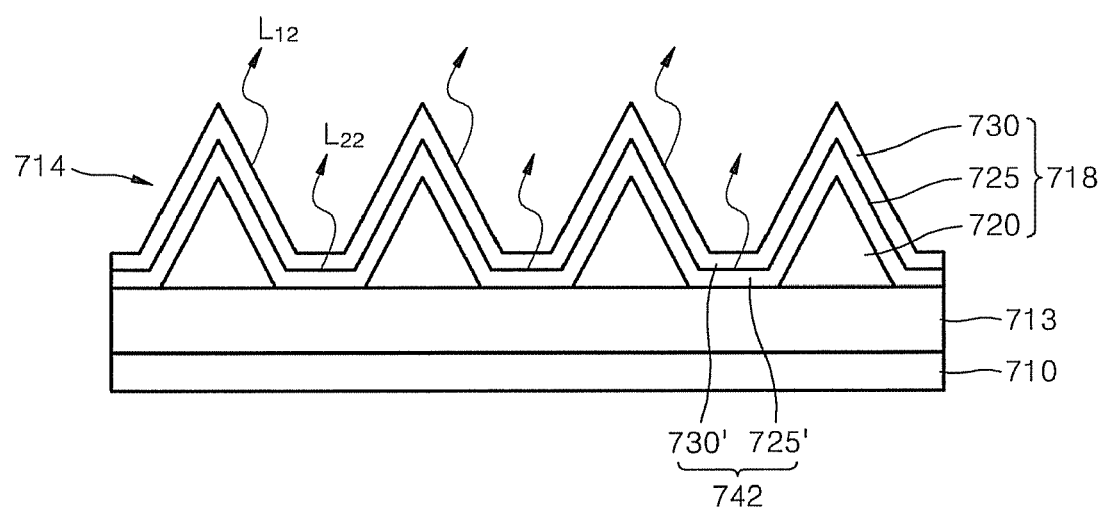

Referring to FIG. 12D, a first active layer 725 is grown on the base portions 720 and a second active layer 725' is grown on exposed portions of the first nitride semiconductor layer 713. The first active layer 725 and the second active layer 725' may be grown simultaneously or concurrently. A second nitride semiconductor layer 730 is grown on the first active layer 725 and a third nitride semiconductor layer 730' is grown on the second active layer 725'. The second nitride semiconductor layer 730 and the third nitride semiconductor layer 730' may be grown simultaneously or concurrently. The base portion 720, the first active layer 725, and the second nitride semiconductor layer 730 form nano-sized light emission portions 718, whereas the second active layer 725' and the third nitride semiconductor layer 730' form multi-layer structures 742. The nano-sized light emission portions 718 include semi-polar surfaces that are inclined with respect to the substrate 710. The multi-layer structures 742 include non-polar surfaces that are in parallel or substantially parallel with the substrate 710.

The nano-sized light emission portions 718 may emit first light $L_{12}$ having a first wavelength, whereas the multi-layer structures 742 may emit second light $L_{22}$ having a second wavelength. The first wavelength may be greater than the second wavelength.

A method of generating multiple wavelength light according to an example embodiment will now be described in more detail.

Figure 19:
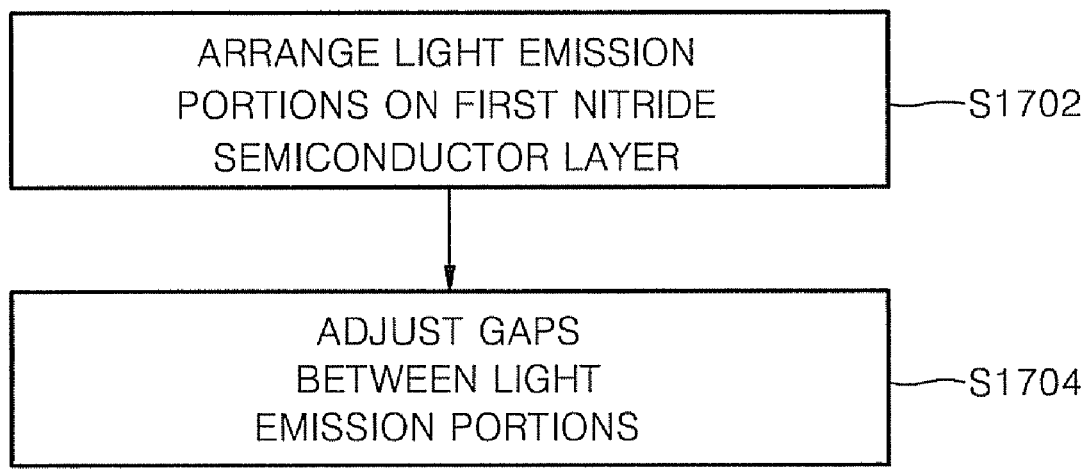
FIG. 19 is a flow chart illustrating a method for generating multi-wavelength light according to an example embodiment.

FIG. 19 is a flow chart illustrating a method for generating multiple wavelengths of light using a single semiconductor die according to an example embodiment.

Referring to FIG. 19, the method includes: arranging light emission portions on a first nitride semiconductor layer (S1702), and adjusting gaps between the light emission portions (S1704). The light emission portions may be nano-sized and will be described as such herein. The nano-sized light emission portions may include semi-polar surfaces. When the gaps between the nano-sized light emission portions are adjusted, dielectric patterns may be disposed between the nano-sized light emission portions or multi-layer structures may be disposed there between. Thus, multiple wavelengths of light may be emitted in a single chip or die without the use of a fluorescent material. In one example, white light may be emitted by emitting multiple wavelengths of light, and light emission efficiency of relatively long wavelengths may increase, thereby generating illumination light suitable for eye sensitivity.

Figure 13:
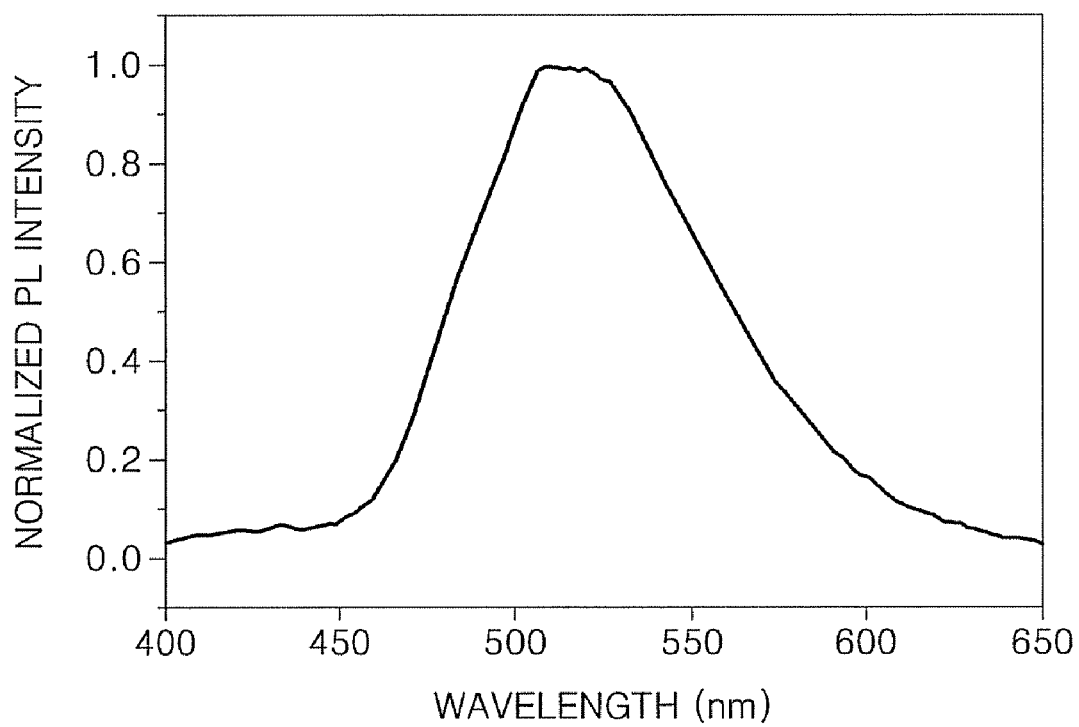
FIG. 13 is a graph of normalized photo-luminescence (PL) intensity versus wavelength for light generated by a semiconductor die configured according to the example embodiment shown in FIG. 1.

FIG. 13 is a graph of normalized photoluminescence (PL) intensity versus wavelength for light generated by a semiconductor die configured according to the example embodiment shown in FIG. 1.

As shown in FIG. 13, for example, the normalized PL intensity varies substantially between wavelengths of about 450 nm and about 650 nm. And, the peak normalized PL intensity is between about 500 nm and about 550 nm.

Figure 14:
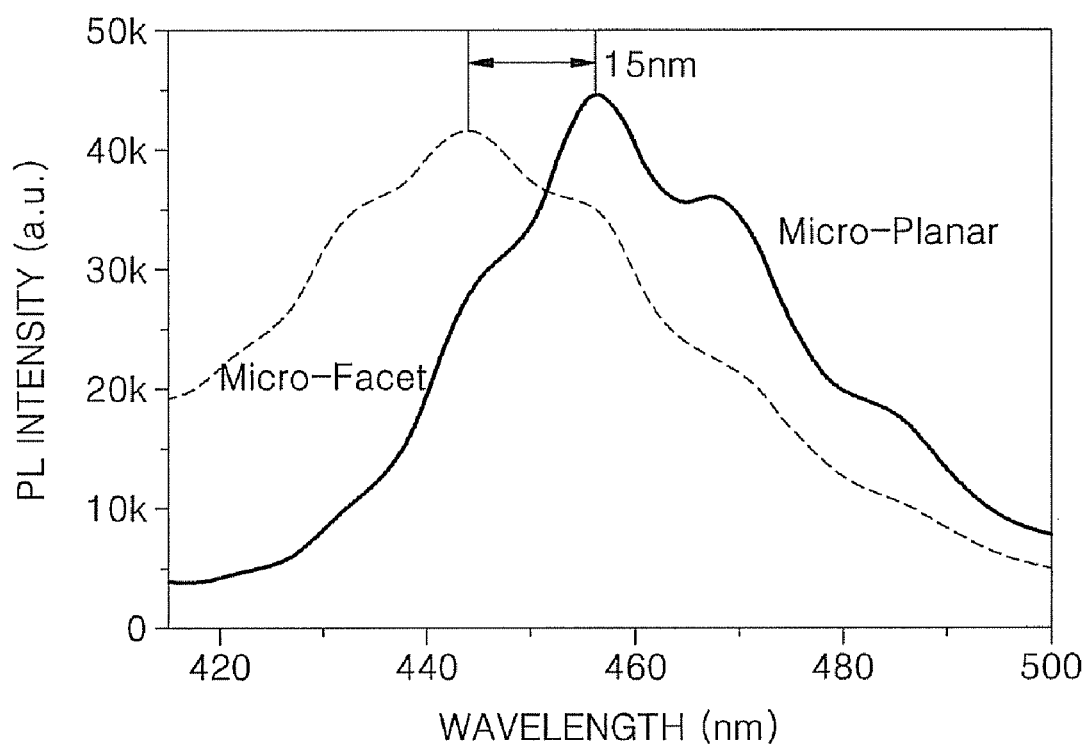
FIG. 14 is a graph of normalized photo-luminescence (PL) intensity versus wavelength for light generated by a semiconductor die configured according to the example embodiment shown in FIG. 5.

FIG. 14 is a graph of normalized photoluminescence (PL) intensity versus wavelength for light generated by a semiconductor die configured according to the example embodiment shown in FIG. 5.

As shown in FIG. 14, the wavelength corresponding to the peak PL intensity light generated by the micro-facet (e.g., light emitting portions 118 in FIG. 5) portions of the semiconductor die differs from the wavelength corresponding to the peak PL intensity of light generated by the micro-planar portions (e.g., multi-layer structures 142a) of the semiconductor die by about 15 nm. In this example, the graph of PL intensity versus wavelength for the micro-facet portions of the semiconductor die is shifted left relative to the graph of PL intensity versus wavelength for the micro-planar portions of the semiconductor die.

FIGS. 15A and 15B are examples of different color arrangements usable to generate white light according to example embodiments. By arranging the nano-sized light emitting portions discussed herein according to the patterns shown in FIGS. 15A and 15B, white light may be generated in a single chip or die.

Referring to FIG. 15A, light emitting portions B, configured to emit blue light, are arranged alternately with light emitting portions Y, configured to emit yellow light, in both the horizontal and vertical directions.

Referring to FIG. 15B, light emitting portions Y, light emitting portions B configured to emit blue light and light emitting portions R configured to emit red light are arranged alternately in both the horizontal and vertical directions.

The patterns illustrated in FIGS. 15A and 15B are only examples. However, example embodiments should not be limited to only these examples. Rather, the nano-sized light emitting portions may be arranged in any suitable manner as desired by one of ordinary skill.

Figure 16:
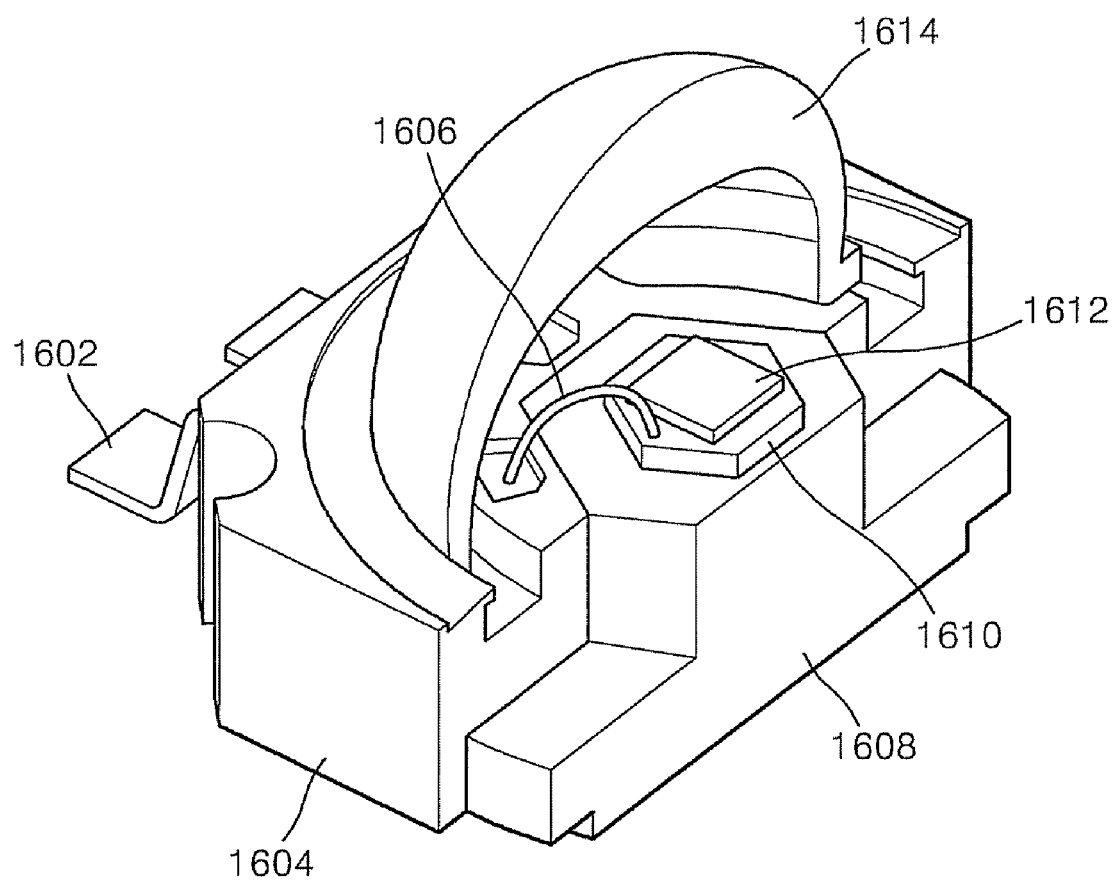
FIG. 16 illustrates a light emitting device (LED) according to an example embodiment.

FIG. 16 illustrates a light emitting device (LED) according to an example embodiment.

Referring to FIG. 16, a semiconductor die 1612 is arranged on a silicon submount 1610. The silicon submount 1610 is arranged on a thermal heat sink 1608, which is enclosed in an outer package 1604. A bond wire 1606 connects the silicon submount 1610 with an anode lead (not shown) of the LED. A cathode lead 1602 is coupled to the silicon submount 1610 via internal circuitry (not shown). A lens 1614 encloses the semiconductor die 1612, the silicon submount 1610 and the bond wire 1606. The semiconductor die 1612 may be one of the semiconductor dies discussed herein.

Semiconductor dies and/or LEDs according to example embodiments may be implemented in various fields of technology. For example, LEDs and/or semiconductor dies according to at least some example embodiments may be implemented as road lighting, decoration lighting, indoor lighting, biomedical lighting, vehicle lights, as display and/or backlights in flat panel display devices (e.g., liquid crystal display (LCD) devices, etc.), display and/or projector lighting, etc.

It should be understood that the example embodiments described herein should be considered in a descriptive sense only and not for purposes of limitation. Descriptions of features or aspects within each example embodiment should typically be considered as available for other similar features or aspects in other embodiments.

What is claimed is:

1. A semiconductor die comprising:
   at least one first region configured to emit light having at least a first wavelength, the at least one first region including a plurality of first light emission structures arranged with a first gap between bases of neighboring ones of the plurality of first light emission structures; and
   at least one second region having one of a planar surface and a plurality of second light emission structures, the planar surface being perpendicular to a protrusion direction of the plurality of first light emission structures, and the plurality of second light emission structures being arranged adjacent to one another, the at least one second region being configured to emit light having at least a second wavelength, which is different from the first wavelength; wherein the plurality of first light emission structures have polypyramid shapes.

2. The semiconductor die of claim 1, wherein the plurality of second light emission structures are arranged adjacent to one another without a gap between bases of adjacent ones of the plurality of second light emission structures.

3. The semiconductor die of claim 1, further comprising:
a plurality of dielectric layer portions, each of the plurality of dielectric layer portions being disposed in a corresponding first gap.

4. The semiconductor die of claim 3, wherein the plurality of dielectric layer portions are not covered by the plurality of first light emission structures.

5. The semiconductor die of claim 1, wherein each of the plurality of first light emission structures includes a plurality of semi-polar surfaces.

6. The semiconductor die of claim 1, further comprising:
a first nitride semiconductor layer on which the at least one first region and the at least one second region are formed; wherein
each of the plurality of first light emission structures includes,
a base portion formed of a same material as the first nitride semiconductor layer,
a first active layer formed on the base portion, and
a second nitride semiconductor layer formed on the first active layer.

7. The semiconductor die of claim 6, wherein a plurality of multi-layer structures are disposed between the plurality of first light emission structures, each of the plurality of multi-layer structures including,
a second active layer,
a third nitride semiconductor layer formed on the second active layer, and
the planar surface.

8. The semiconductor die of claim 7, wherein the multi-layer structures emit light having the second wavelength, and wherein the first wavelength is longer than the second wavelength.

9. The semiconductor die of claim 1, further comprising:
a plurality of first regions and a plurality of second regions arranged alternately on a substrate.

10. The semiconductor die of claim 9, wherein the plurality of first regions and the plurality of second regions are arranged to form a light emission array.

11. The semiconductor die of claim 1, wherein the at least one second region includes the planar surface having a first width, and wherein the first width is larger than a width of the first gap.

12. The semiconductor die of claim 1, wherein the at least one second region includes the plurality of second light emission structures, and wherein the at least one first region is separated from the at least one second region by a second gap.

13. The semiconductor die of claim 12, wherein a width of the first gap is the same width as a width of the second gap.

14. The semiconductor die of claim 1, wherein the plurality of first light emission structures and the plurality of second light emission structures are nano-sized light emission structures.

15. A light emitting device comprising:
at least one semiconductor die of claim 1.

16. The light emitting device of claim 15, further comprising:
a thermal heat sink;
a silicon submount arranged on the thermal heat sink, the at least one semiconductor die being arranged on the silicon submount;
an anode lead and a cathode lead coupled to the silicon submount;
an outer package enclosing the thermal heat sink; and
a lens enclosing the silicon submount and the at least one semiconductor die.

17. A semiconductor die comprising:
at least one first region including a plurality of first light emission structures configured to emit light having a first wavelength, the plurality of first light emission structures being arranged with a first gap between bases of neighboring ones of the plurality of first light emission structures; and
at least one second region including a plurality of second light emission structures configured to emit light having a second wavelength, the plurality of second light emission structures being arranged with a second gap between bases of neighboring ones of the plurality of second light emission structures, a width of the second gap being different from a width of the first gap and the first wavelength being different from the second wavelength; wherein
the plurality of first light emission structures have polypyramid shapes.

18. The semiconductor die of claim 17, further comprising:
a dielectric layer disposed in each first and second gap.

19. The semiconductor die of claim 17, further comprising:
at least one third region including a plurality of third light emission structures configured to emit light having a third wavelength, the plurality of third light emission structures being arranged with a third gap between bases of neighboring ones of the plurality of first light emission structures, a width of the third gap being different from the widths of the first and second gaps, and the third wavelength being different from the first and second wavelengths.

20. The semiconductor die of claim 19, wherein the plurality of first light emission structures, the plurality of second light emission structures, and the plurality of third light emission structures are a same size.

21. The semiconductor die of claim 19, further comprising:
a dielectric layer disposed in each first, second and third gap.

22. The semiconductor die of claim 17, wherein the plurality of first light emission structures and the plurality of second light emission structures are nano-sized.

23. The semiconductor die of claim 17, wherein the plurality of first light emission structures and the plurality of second light emission structures are a same size.

24. The semiconductor die of claim 17, further comprising:
a first nitride semiconductor layer on which the at least one first region and the at least one second region are formed; wherein
each of the plurality of first light emission structures and the plurality of second light emission structures includes,
a base portion formed of a same material as the first nitride semiconductor layer,
a first active layer formed on the base portion, and
a second nitride semiconductor layer formed on the first active layer.

25. A light emitting device comprising: at least one semiconductor die of claim 17.

26. The light emitting device of claim 25, further comprising:
a thermal heat sink;

a silicon submount arranged on the thermal heat sink, the at least one semiconductor die being arranged on the silicon submount;
an anode lead and a cathode lead coupled to the silicon submount;
an outer package enclosing the thermal heat sink; and
a lens enclosing the silicon submount and the at least one semiconductor die.

27. A semiconductor die comprising:
at least one first region including a plurality of first light emission structures having a first size, the plurality of first light emission structures being arranged with a first gap between bases of neighboring ones of the plurality of first light emission structures and being configured to emit light having a first wavelength; and
at least one second region including a plurality of second light emission structures having a second size, which is different from the first size, the plurality of second light emission structures being arranged with a second gap between bases of neighboring ones of the plurality of second light emission structures, and being configured to emit light having a second wavelength; wherein
the plurality of first light emission structures have polypyramid shapes,
the first wavelength and the second wavelength are different, and
widths of the first and second gaps are the same.

28. The semiconductor die of claim 27, further comprising:
a first nitride semiconductor layer on which the at least one first region and the at least one second region are formed; wherein
each of the plurality of first light emission structures and each of the plurality of second light emission structures includes,
a base portion formed of a same material as the first nitride semiconductor layer,
a first active layer formed on the base portion, and
a second nitride semiconductor layer formed on the first active layer.

29. The semiconductor die of claim 27, further comprising:
dielectric layer disposed in each first and second gap.

30. The semiconductor die of claim 27, wherein the plurality of first light emission structures and the plurality of second light emission structures are nano-sized light emission structures.

31. A light emitting device comprising:
at least one semiconductor die of claim 27.

32. The light emitting device of claim 31, further comprising:
a thermal heat sink;
a silicon submount arranged on the thermal heat sink, the at least one semiconductor die being arranged on the silicon submount;
an anode and a cathode lead coupled to the silicon submount;
an outer package enclosing the thermal heat sink; and
a lens enclosing the silicon submount and the at least one semiconductor die.

33. A semiconductor die comprising:
a plurality of light emission structures configured to emit light having a first wavelength, the plurality of light emission structures having polypyramid shapes; and
a plurality of planar light emission surfaces configured to emit light having a second wavelength, the plurality of light emission structures and the plurality of planar light emission surfaces being arranged alternately on a substrate, and the first wavelength being different from the second wavelength.

34. The semiconductor die of claim 33, wherein the plurality of light emission structures and the plurality of planar light emission surfaces are nano-sized.

35. The semiconductor die of claim 33, wherein a surface of the planar light emission surfaces is perpendicular to a protrusion direction of the plurality of light emission structures.

36. The semiconductor die of claim 33, further comprising:
a first nitride semiconductor layer on which the plurality of light emission structures and the plurality of planar light emission surfaces are formed; wherein
each of the plurality of light emission structures includes,
a base portion formed of a same material as the first nitride semiconductor layer,
a first active layer formed on the base portion, and
a second nitride semiconductor layer formed on the first active layer.

37. The semiconductor die of claim 33, further comprising:
a first nitride semiconductor layer on which the plurality of light emission structures and the plurality of planar light emission surfaces are formed; wherein
each of the plurality of planar light emission surfaces have a structure including,
a second active layer,
a third nitride semiconductor layer formed on the second active layer, and
a non-polar surface.

38. A light emitting device comprising:
at least one semiconductor die of claim 33.

39. The light emitting device of claim 38, further comprising:
a thermal heat sink;
a silicon submount arranged on the thermal heat sink, the at least one semiconductor die being arranged on the silicon submount;
an anode lead and a cathode lead coupled to the silicon submount;
an outer package enclosing the thermal heat sink; and
a lens enclosing the silicon submount and the at least one semiconductor die.

* * * * *